US012696756B2

(12) United States Patent
Cheng et al.

(10) Patent No.: US 12,696,756 B2
(45) Date of Patent: Jul. 28, 2026

(54) INTERCONNECTION STRUCTURE AND METHOD FOR FABRICATING THE SAME

(71) Applicant: TAIWAN SEMICONDUCTOR MANUFACTURING COMPANY, LTD., Hsinchu (TW)

(72) Inventors: Kai-Fang Cheng, Hsinchu (TW);
Cherng-Shiaw Tsai, Hsinchu (TW);
Cheng-Chin Lee, Hsinchu (TW);
Yen-Ju Wu, Hsinchu (TW);
Hsiao-Kang Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 924 days.

(21) Appl. No.: 17/877,387

(22) Filed: Jul. 29, 2022

(65) Prior Publication Data

US 2024/0038665 A1     Feb. 1, 2024

(51) Int. Cl.
| | |
|---|---|
| *H10W 20/47* | (2026.01) |
| *H10W 20/00* | (2026.01) |
| *H10W 20/44* | (2026.01) |
| *H10W 20/48* | (2026.01) |
| *H10W 20/41* | (2026.01) |

(52) U.S. Cl.
CPC ..... *H10W 20/4462* (2026.01); *H10W 20/037* (2026.01); *H10W 20/071* (2026.01); *H10W* 20/47 (2026.01); *H10W 20/48* (2026.01); *H10W 20/425* (2026.01)

(58) Field of Classification Search
CPC ......... H01L 23/53295; H01L 21/76849; H01L 21/76832; H10W 20/47; H10W 20/48
See application file for complete search history.

(56) References Cited

U.S. PATENT DOCUMENTS

| | | | | |
|---|---|---|---|---|
| 7,091,088 | B1 * | 8/2006 | Cheng | H10B 43/30 |
| | | | | 438/257 |
| 8,779,600 | B2 * | 7/2014 | Nguyen | H01L 21/76825 |
| | | | | 257/E21.24 |
| 9,613,908 | B2 * | 4/2017 | Padhi | H01L 21/02145 |
| 9,761,482 | B2 * | 9/2017 | Clevenger | H01L 23/5329 |
| 11,069,613 | B2 * | 7/2021 | Lee | H01L 23/528 |
| 2021/0082832 | A1 * | 3/2021 | Yang | H01L 21/76829 |
| 2022/0157710 | A1 * | 5/2022 | Li | H01L 23/5283 |

* cited by examiner

*Primary Examiner* — Daniel Luke
(74) *Attorney, Agent, or Firm* — Birch, Stewart, Kolasch & Birch, LLP

(57) ABSTRACT

An interconnection structure is provided to include an interlayer dielectric (ILD) layer that is disposed over a substrate, a metal via that is disposed in the ILD layer, and a metal wire that is disposed over the metal via in the ILD layer and that is electrically connected to the metal via. The ILD layer includes silicon carbon nitride.

20 Claims, 23 Drawing Sheets

INTERCONNECTION STRUCTURE AND METHOD FOR FABRICATING THE SAME

BACKGROUND

The semiconductor integrated circuit (IC) industry has over the past decades experienced tremendous advancements and is still experiencing vigorous development. However, advances in IC design need to be accompanied by improvements in manufacturing in order to optimize device performance. As an example, interconnections between different layers of wires and associated dielectrics play a role in IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
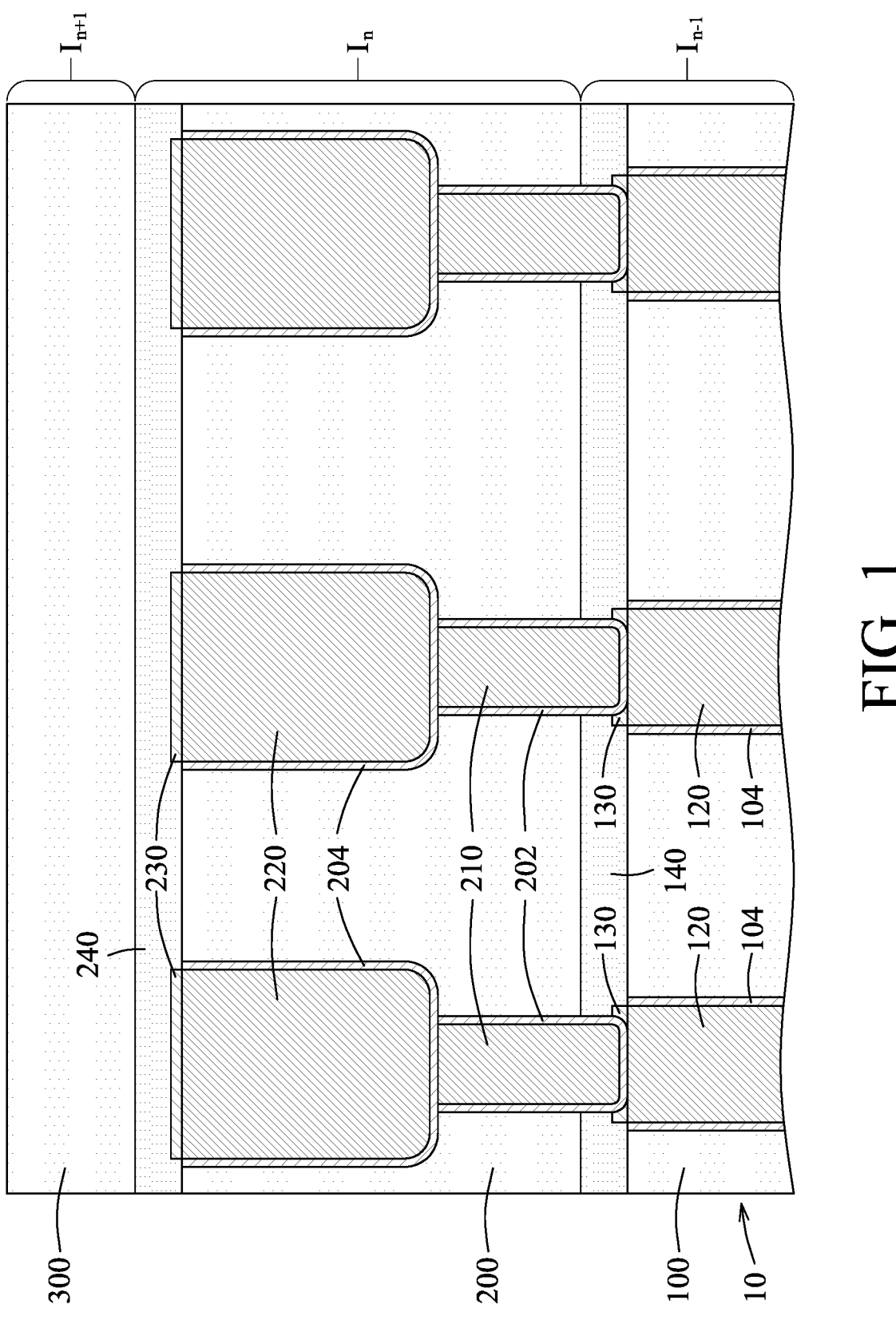
FIG. 1 is a sectional view of an interconnection structure in accordance with some embodiments, taken along line I-I in FIG. 2.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
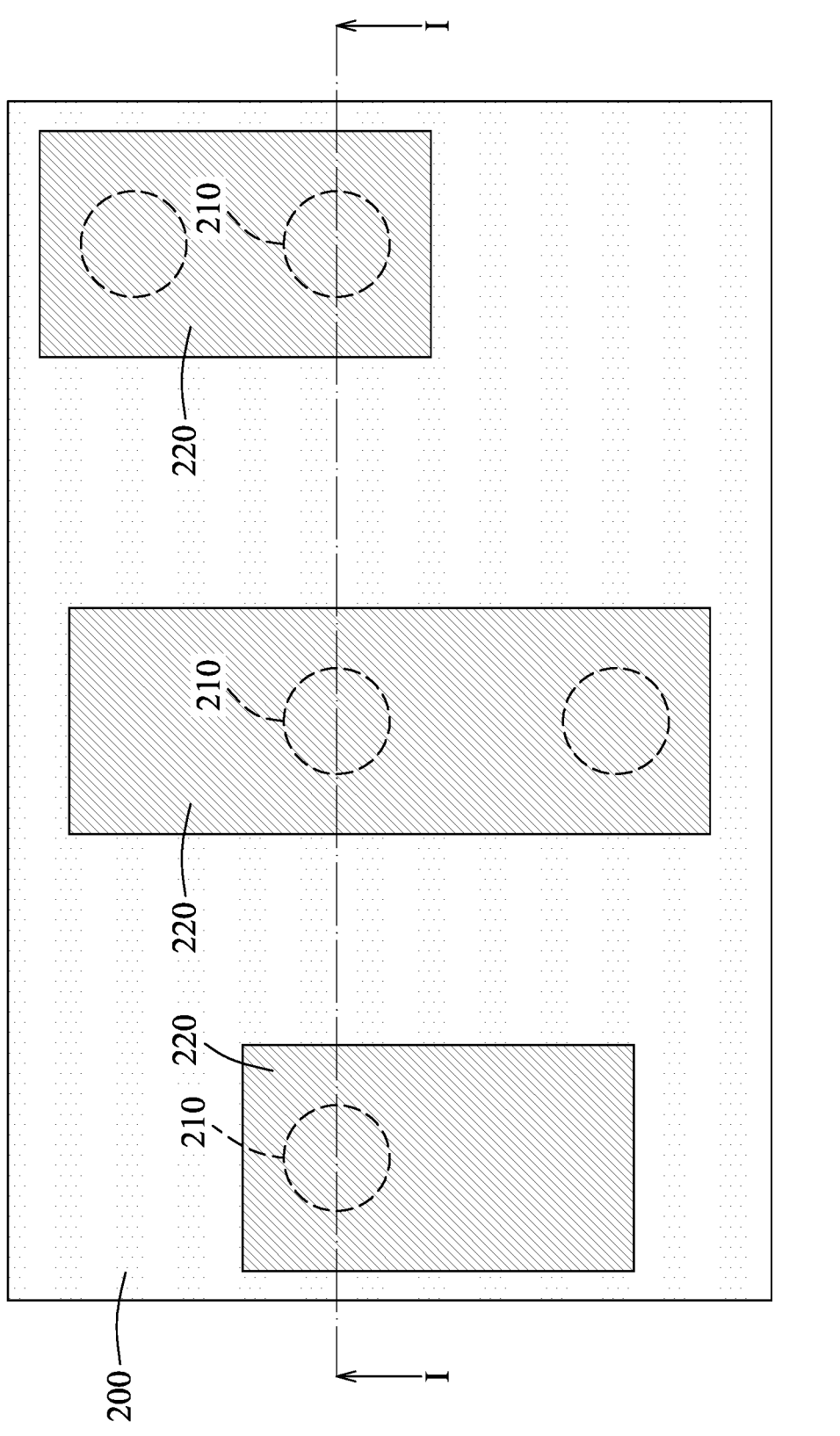
FIG. 2 is an exemplary top view of an exemplary wire routing in the interconnection structure in accordance with some embodiments, with some features being omitted.

FIG. 1 illustrates a sectional view of an exemplary interconnection structure that is formed over a substrate 10, where the sectional view is taken along line I-I in FIG. 2 that provides a top view of an exemplary wire routing in the interconnection structure in accordance with some embodiments. In FIG. 2, multiple metal wires 220 are exemplified to extend in the same direction for the sake of clarity. In accordance with some embodiments, the metal wires 220 may extend in either the same direction or different directions that are perpendicular to a thickness direction (e.g., a vertical direction in FIG. 1) of the substrate 10, but this disclosure is not limited in this respect. The substrate 10 may be a bulk semiconductor substrate or a semiconductor-on-insulator (SOI) substrate, which may be doped (e.g., with a p-type or an n-type dopant) or undoped. In some embodiments, an SOI substrate includes a layer of a semiconductor material formed on an insulator layer. The insulator layer may be a buried oxide (BOX) layer, a silicon oxide layer or any other suitable layer. The insulator layer may be provided on a suitable substrate, such as silicon, glass or the like. The substrate 10 may be made of a suitable semiconductor material, such as silicon or the like. In some embodiments, the substrate 10 is a silicon substrate; and in other embodiments, the substrate 10 is made of a compound semiconductor such as silicon carbide, gallium arsenide, indium arsenide, indium phosphide or other suitable materials. In still other embodiments, the substrate 10 is made of an alloy semiconductor such as GaAsP, AlInAs, AlGaAs, GaInAs, GaInP, GaInAsP or other suitable materials.

In some embodiments, the substrate 10 includes various p-type doped regions and/or n-type doped regions, such as p-type wells, n-type wells, p-type source/drain features and/or n-type source/drain features (source/drain feature(s) may refer to a source or a drain, individually or collectively depending upon the context), formed by a suitable process such as ion implantation, thermal diffusion, a combination thereof, or the like. In some embodiments, the substrate 10 may include other functional elements such as resistors, capacitors, diodes, transistors, and/or the like. The transistors are, for example, field effect transistors (FETs), such as planar FETs and/or 3D FETs (e.g., FinFETs, GAAFETs). The substrate 10 may include lateral isolation features (e.g., shallow trench isolation (STI)) configured to separate various functional elements formed on the substrate 10 and/or various functional elements formed in the substrate 10.

In accordance with some embodiments, the substrate 10 may be formed with a plurality of interconnection layers, and the interconnection layers may have either the same or different interconnection structures. In this disclosure, when no other specifications are made, the interconnection structure refers to that of an $n^{th}$ interconnection layer $I_n$ that is formed over an $(n-1)^{th}$ interconnection layer and the interconnection structure of the $(n-1)^{th}$ interconnection layer $I_{n-1}$ may either be the same as or different from the interconnection structure of the interconnection layer $I_n$. The interconnection structure of the interconnection layer $I_n$ includes an interlayer dielectric (ILD) layer 200 that is formed over the interconnection layer $I_{n-1}$, multiple interconnection features that are formed in the ILD layer 200, multiple conductive cap features 230 that are respectively disposed over the interconnection features, and a hermetic etch stop layer (ESL) 240 that is formed over the ILD layer 200 and the conductive cap features 230. It should be noted that in FIG. 2, an $(n+1)^{th}$ interconnection layer $I_{n+1}$ that is formed over the $n^{th}$ interconnection layer $I_n$, and the conductive cap features 230 and the ESL 240 of the $n^{th}$ interconnection layer $I_n$ are omitted.

Figure 3:
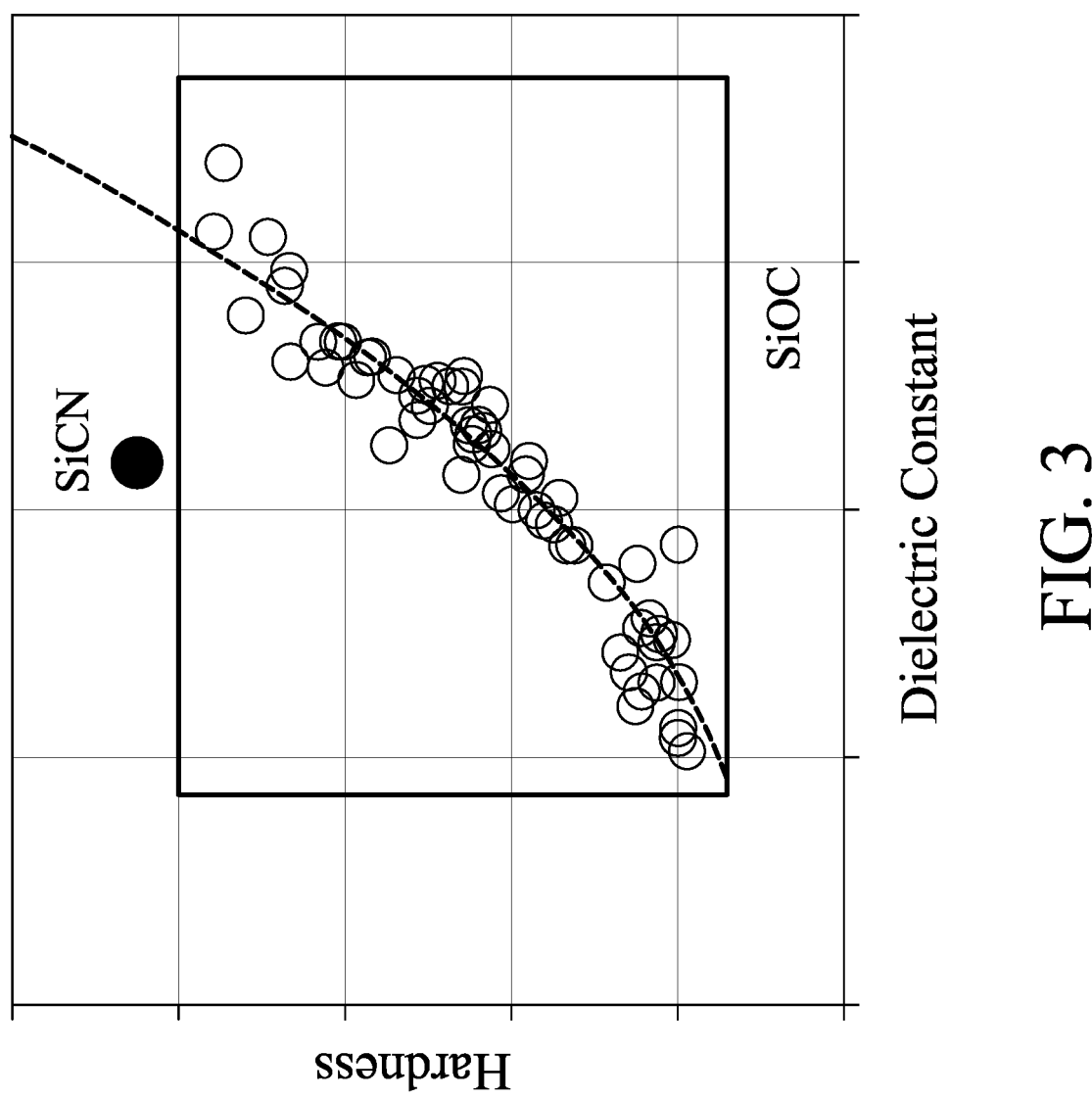
FIG. 3 is a plot that illustrates a comparison of hardness between silicon oxycarbide and silicon carbon nitride.
Figure 4:
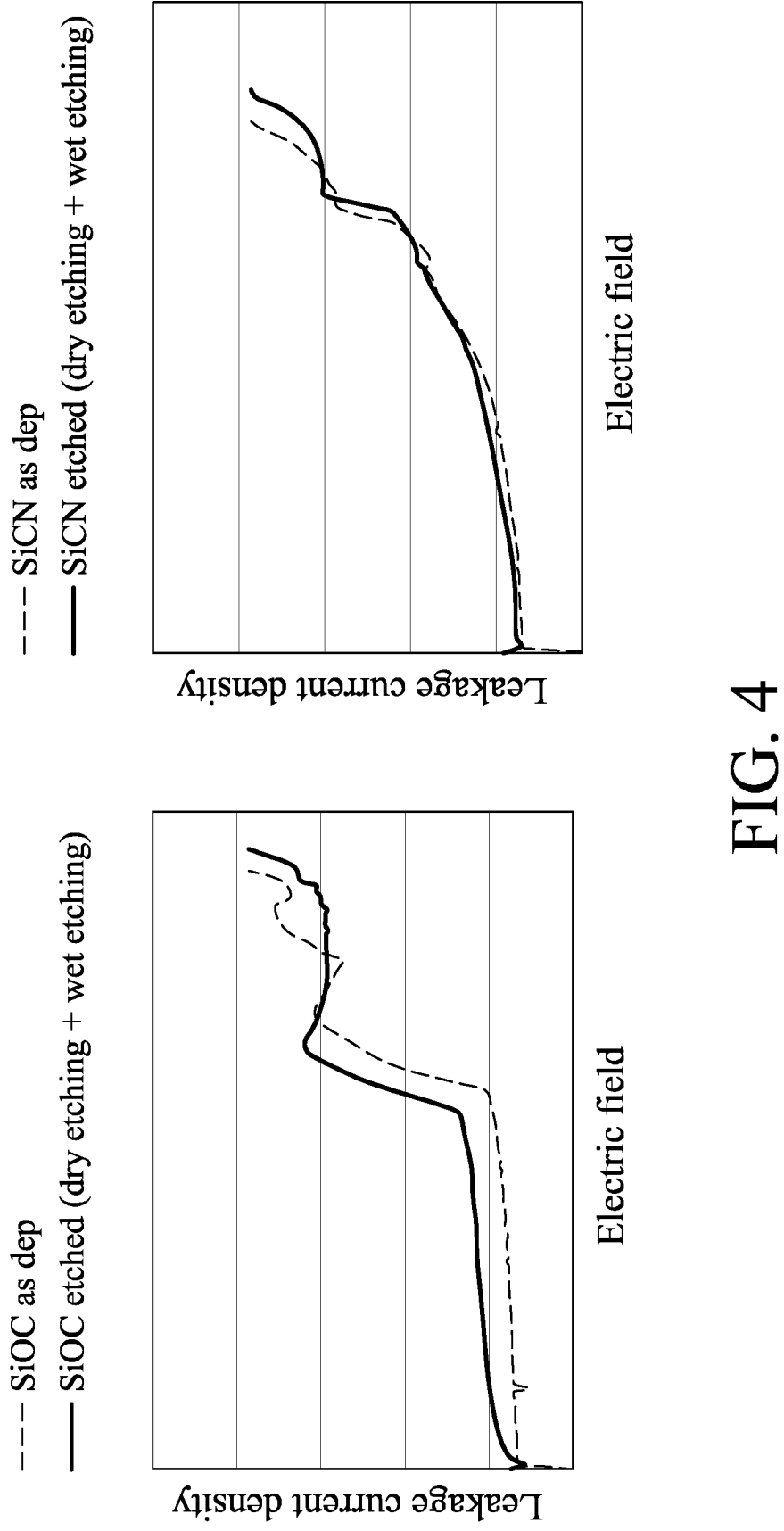
FIG. 4 provides two plots that illustrate variation of silicon oxycarbide and silicon carbon nitride before and after an etching process.

In accordance with some embodiments, the ILD layer 200 may include silicon oxycarbide (represented by $Si_xO_yC_z$, or simply SiOC), other suitable materials, or any combination thereof. In accordance with some embodiments, the ILD layer 200 may include silicon carbon nitride (represented by $Si_xC_yN_z$, or simply SiCN), other suitable materials, or any combination thereof. In comparison to silicon oxycarbide, silicon carbon nitride may have better thermal conductivity, better mechanical strength, and better resistance against etching. The dielectric constant of silicon oxycarbide ranges from about 2.5 to about 4.0, and the dielectric constant of silicon carbon nitride ranges from about 2.5 to about 3.6, so the ILD layer that is made of silicon carbon nitride may achieve similar or better performance than the ILD layer that is made of silicon oxycarbide in terms of resistive-capacitive (RC) delay. The thermal conductivity of silicon oxycarbide ranges from about 0.1 W/(m·K) to about 0.3 W/(m·K), while the thermal conductivity of silicon carbon nitride ranges from about 0.6 W/(m·K) to about 1.3 W/(m·K), so the ILD layer that is made of silicon carbon nitride may be better than the ILD layer that is made of silicon oxycarbide in terms of heat dissipation, thereby alleviating local heating and enhancing IC performance. FIG. 3 illustrates a comparison of hardness between silicon oxycarbide and silicon carbon nitride. The data points that correspond to silicon oxycarbide have a trend that shows increasing hardness with increasing dielectric constant of the silicon oxycarbide. The data point that corresponds to silicon carbon nitride shows that, with the same dielectric constant, silicon carbon nitride has better hardness than silicon oxycarbide. Therefore, silicon carbon nitride has a better mechanical strength than silicon oxycarbide, and may thus reduce a chance of damages (e.g., cracks) to the ILD layer during a packaging process (e.g., bumping process). FIG. 4 illustrates variations of leakage density versus electric field for the ILD layers of different materials after a dry etching process and a wet etching process were performed in series, where the dry etching process was used to pattern the ILD layers, and the wet etching process was used to remove impurities that were left on the substrate after the dry etching process. It can be seen in a left plot in FIG. 4 that the ILD layer of silicon oxycarbide has a greater leakage current density and a smaller electric field to break down after the etching processes, while no obvious degradation is observed in the leakage current density and the electric field to break down when the ILD layer is a layer of silicon carbon nitride. Furthermore, the dielectric constant of the ILD layer of silicon oxycarbide was found to increase by more than 5% after the dry etching process and the wet etching process were performed, and the dielectric constant of the ILD layer of silicon carbon nitride was found to increase by less than 2% after undergoing the same processes. According to the abovementioned experimental results, it can be seen that the ILD layer of silicon carbon nitride has better resistance to etching processes, which means that less degradation in terms of electrical and low-k properties may be done to the ILD layer of silicon carbon nitride by the etching processes when compared to the ILD layer of silicon oxycarbide, so IC performance with the ILD layer being made of silicon carbon nitride is better than IC performance with the ILD layer being made of silicon oxycarbide.

Referring to FIGS. 1 and 2 again, since the interconnection features have similar structures, only one of the interconnection features (e.g., the central one of the interconnection features in FIG. 1) is described in more detail hereinafter for the sake of brevity. The interconnection feature includes a metal via 210 and a metal wire 220 that are surrounded by the ILD layer 200. In the illustrative embodiment, the metal wire 220 extends in a horizontal direction that is perpendicular to the thickness direction of the substrate 10, and the metal via 210 extends through a hermetic etch stop layer 140 and a conductive cap feature 130 of the interconnection layer in the thickness direction of the substrate 10, and thus connects the metal wire 220 to a metal wire 120 of the interconnection layer $I_{n-1}$. In accordance with some embodiments, the metal via 210 may be formed to connect the metal wire 220 to a circuit device that is disposed under the interconnection layer $I_n$. In accordance with some embodiments, the interconnection feature may be formed for testing purposes, and the metal via 210 does not extend through the hermetic etch stop layer 140. In accordance with some embodiments, the metal via 210 and the metal wire 220 may include, for example, Cu, Ni, Co, Ru, Ir, Al, Pt, Pd, Au, Ag, Os, W, Mo, related alloys, other suitable materials, or any combination thereof.

In the illustrative embodiment, a first liner layer 202 is disposed between the metal via 210 and the ILD layer 200, and a second liner layer 204 is disposed between the metal wire 220 and the ILD layer 200. The first liner layer 202 and the second liner layer 204 are formed to prevent diffusion of metal in the metal via 210 and the metal wire 220 into the ILD layer 200, and may include, for example, Ti, TiN, Ta, TaN, other suitable materials, or any combination thereof. In the illustrative embodiment, a portion of the second liner layer 204 is disposed between the metal via 210 and the metal wire 220. In accordance with some embodiments, the metal wire 220 is directly connected to the metal via 210, and no liner layer is formed between the metal wire 220 and the metal via 210.

The conductive cap feature 230 is disposed over the metal wire 220 to prevent metal in the interconnection feature from diffusing into an ILD layer 300 of the interconnection layer $I_{n+1}$ that is formed over the interconnection layer $I_n$. In accordance with some embodiments, the conductive cap feature 230 may have the same pattern as the metal wire 220 from the top view, and covers the metal wire 220. In accordance with some embodiments, the conductive cap feature 230 may be a metal layer that includes, for example, cobalt, other suitable materials, or any combination thereof. In accordance with some embodiments, the conductive cap feature 230 may be a graphene layer, a non-metal layer that includes other suitable low-resistance materials, or any combination thereof. In comparison to cobalt, graphene has lower electrical resistance, and thus is advantageous in terms of signal transmission and in having less RC delay. In accordance with some embodiments, the conductive cap feature 230 is a graphene layer that has a thickness in a range from about 20 angstroms to about 100 angstroms. An excessively thin graphene layer (e.g., smaller than 20 angstroms in thickness) may be insufficient to prevent the metal in the interconnection feature from diffusing into the ILD layer 300, and an excessively thick graphene layer (e.g., greater than 100 angstroms in thickness) may unnecessarily increase manufacturing cost.

The hermetic etch stop layer 240 is in contact with the ILD layer 200 and the conductive cap feature 230, and is disposed between the ILD layer 200 of the interconnection layer $I_n$ and the ILD layer 300 of the interconnection layer $I_{n+1}$. In accordance with some embodiments, the hermetic etch stop layer 240 may include silicon nitride, aluminum nitride, aluminum oxide, silicon carbon nitride, aluminum oxycarbide, other suitable materials, or any combination thereof. Al-based materials (e.g., aluminum nitride, aluminum oxide, aluminum oxycarbide, etc.) may have better thermal conductivity, and thus can provide better heat dissipation and prevent local heating when used in the hermetic etch stop layer 240. Silicon carbon nitride has a low etching rate (which may be about 1/3 to about 1/5 the etching rate of silicon oxycarbide), and thus can be used as the hermetic etch stop layer 240. In accordance with some embodiments where silicon carbon nitride is used in the hermetic etch stop layer 240 and the ILD layers 200, 300, the hermetic etch stop layer 240 and the ILD layers 200, 300 may use either the same silicon carbon nitride material or different silicon carbon nitride materials. As an example, assuming that an atomic ratio among silicon, carbon and nitrogen in the silicon carbon nitride of the ILD layers 200, 300 is $x_1:y_1:z_1$, and an atomic ratio among silicon, carbon and nitrogen in the silicon carbon nitride of the hermetic etch stop layer 240 is $x_2:y_2:z_2$, the atomic ratio $x_1:y_1:z_1$ may be either the same or different from the atomic ratio $x_2:y_2:z_2$. For example, the atomic ratio $x_2:y_2:z_2$ may be determined such that the hermetic etch stop layer 240 has a lower etching rate than the ILD layers 200, 300. In accordance with some embodiments, the hermetic etch stop layer 240 may have a multilayer structure. For example, the hermetic etch stop layer 240 may include a silicon carbon nitride layer and one or more Al-based dielectric layers (e.g., aluminum nitride layers, aluminum oxide layers, and/or aluminum oxycarbide layers) that are stacked together for enhancing etching selectivity and/or thermal conductivity of the hermetic etch stop layer 240. In accordance with some embodiments, the hermetic etch stop layer 240 may have a thickness in a range from about 60 angstroms to about 150 angstroms. An excessively thin hermetic etch stop layer 240 (e.g., smaller than 60 angstroms in thickness) may be insufficient to block moisture from entering the ILD layer 200 and the interconnection features in the interconnection layer $I_n$, and an excessively thick hermetic etch stop layer 240 (e.g., greater than 150 angstroms in thickness) may result in failure of photoresist exposure for patterning the ILD layer 300.

It is noted that different interconnection layers may have similar structures (e.g., including an ILD layer, interconnection features, liner layers, conductive cap features, and a hermetic etch stop layer, etc.), but the materials used in the different interconnection layers may be either the same or different. That is, the ILD layers (e.g., the ILD layers 100, 200, 300) in different interconnection layers (e.g., the interconnection layers $I_{n-1}$, $I_n$, $I_{n+1}$) may use either the same dielectric material or different dielectric materials; the interconnection features (e.g., the metal vias 210 and the metal wires 120, 220) in different interconnection layers (e.g., the interconnection layers $I_{n-1}$, $I_n$) may use either the same metallic material or different metallic materials; the liner layers (e.g., the liner layers 104, 202, 204) in different interconnection layers (e.g., the interconnection layers $I_{n-1}$, $I_n$) may have either the same structure or different structures, and may use either the same material or different materials; the conductive cap features (e.g., the conductive cap features 130, 230) may have either the same structure or different structures (e.g., a single-layer structure or a multilayer structure), and may use either the same conductive material or different conductive materials; and the hermetic etch stop layers (e.g., the etch stop layers 140, 240) in different interconnection layers (e.g., the interconnection layers $I_{n-1}$, $I_n$) may have either the same structure or different structures (e.g., a single-layer structure or a multilayer structure), and may use either the same dielectric material or different dielectric materials.

Figure 5:
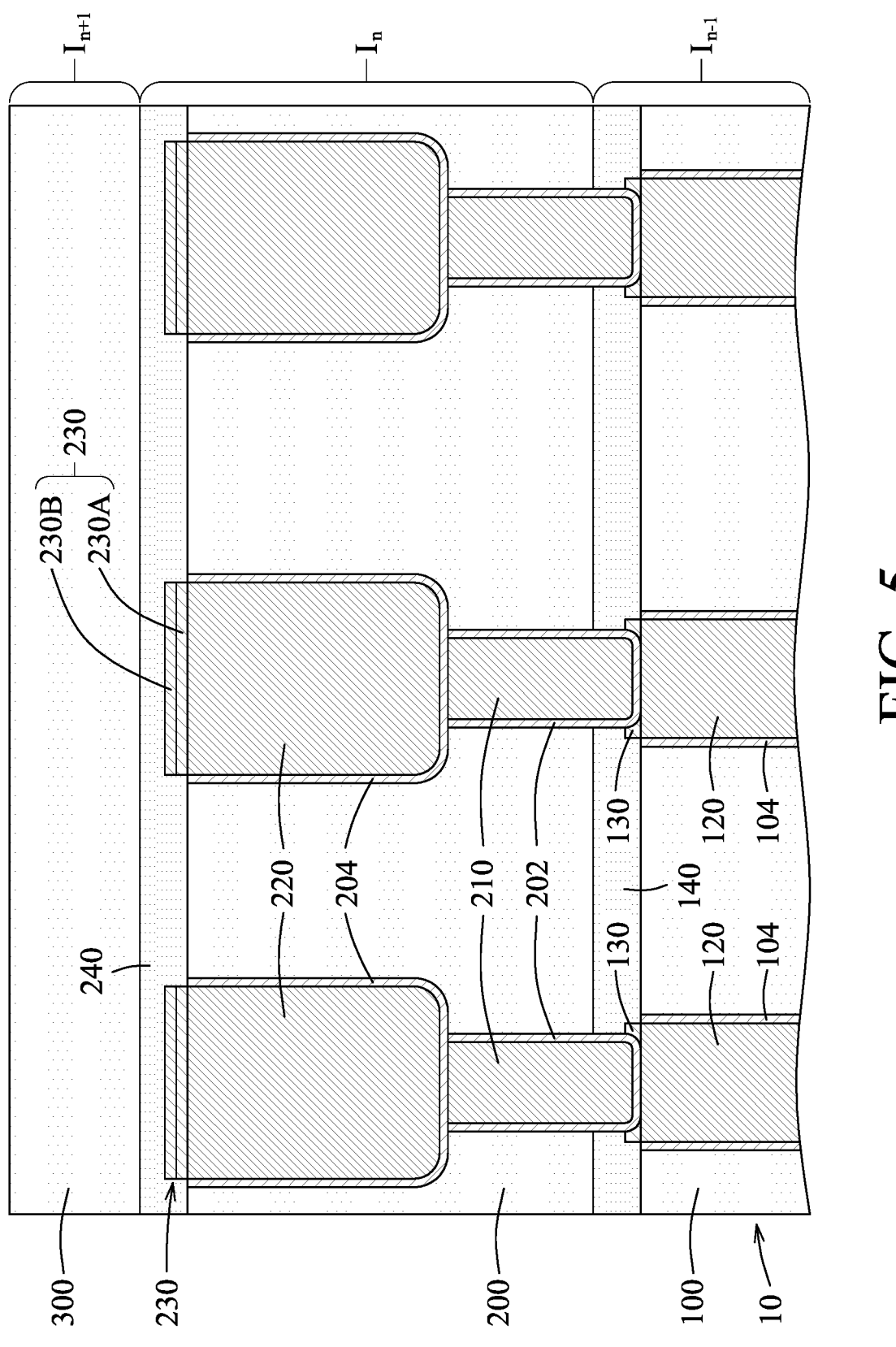
FIGS. 5 through 11 illustrate variations of the interconnection structure in accordance with some embodiments.

FIG. 5 illustrates a variation of the interconnection structure in accordance with some embodiments. In comparison to FIG. 1, the conductive cap feature 230 in FIG. 5 has a multilayer structure, and includes a metal layer 230A and a non-metal layer 230B that are stacked together in the thickness direction of the substrate 10. In accordance with some embodiments, the metal layer 230A includes cobalt, other suitable materials, or any combination thereof, and the non-metal layer 230B includes graphene, other suitable low-resistance non-metal materials, or any combination thereof. In the illustrative embodiment, the non-metal layer 230B is formed over the metal layer 230A. In some embodiments, the metal layer 230A may be formed over the non-metal layer 230B. The multilayer structure may further enhance the ability to prevent the metal in the interconnection feature from diffusing into the ILD layer 300 of the interconnection layer $I_{n+1}$.

Figure 6:
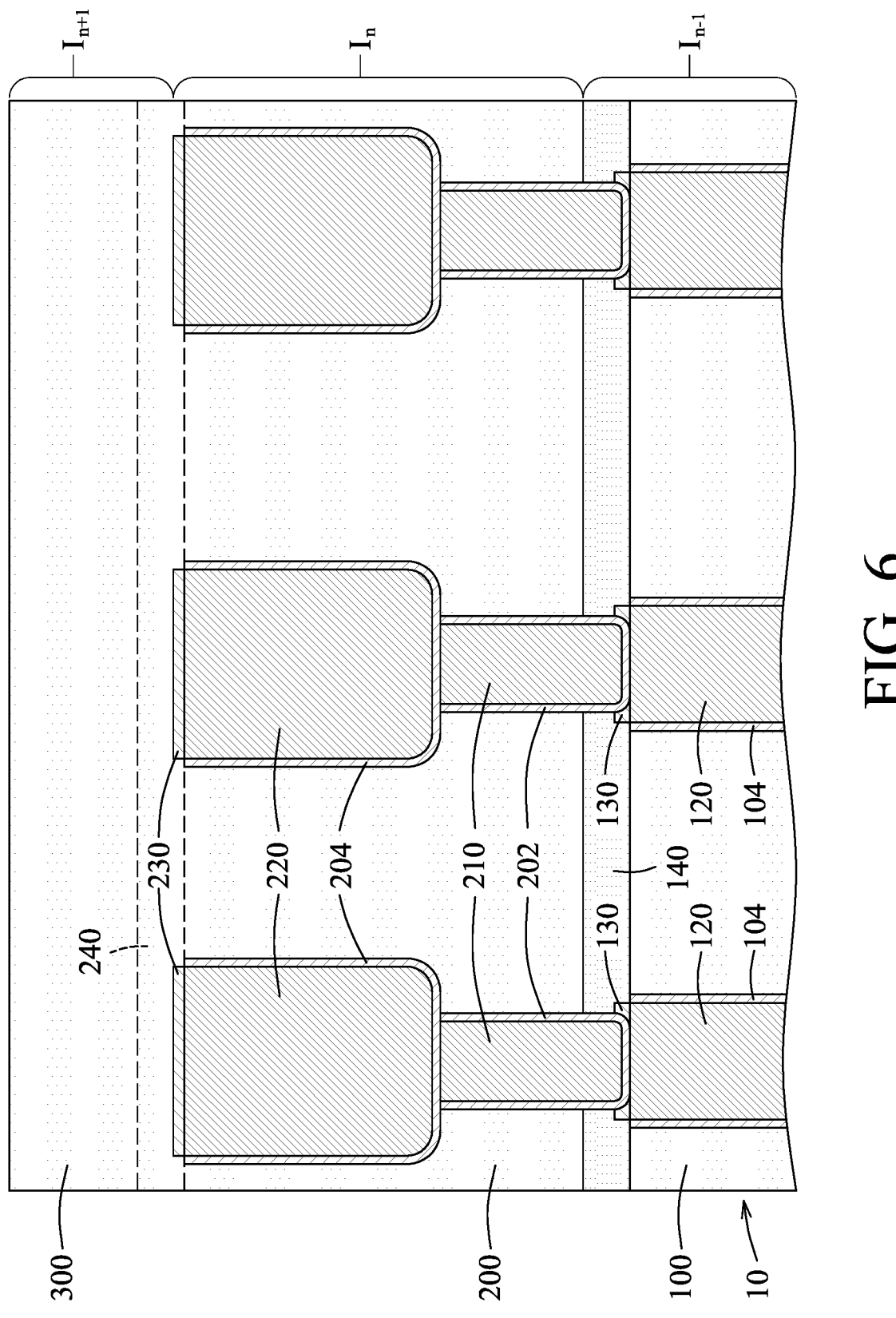

FIG. 6 illustrates a variation of the interconnection structure in accordance with some embodiments. In comparison to FIG. 1, the hermetic etch stop layer 240 and the ILD layer 300 in FIG. 6 are made of the same material, and thus can be formed in a single deposition process. In other words, the structure of the interconnection layer $I_n$ shown in FIG. 6 is substantially an ESL-free structure, where the ILD layer 300 is disposed over and in contact with the ILD layer 200 and the conductive cap feature 230, and a bottom portion of the ILD layer 300 serves as the hermetic etch stop layer 240 of the interconnection layer $I_n$. As mentioned hereinabove, silicon carbon nitride has a low etching rate, so time for etching the ILD layer that is made of silicon carbon nitride can be precisely controlled to achieve a required etching depth, and thus silicon carbon nitride is suitable to be used in the ILD layer 300 that also serves as the etch stop layer 240 in the illustrative embodiment. In accordance with some embodiments, the interconnection layer $I_{n-1}$ may also be formed in an ESL-free structure, and this disclosure is not limited in this respect.

Figure 7:
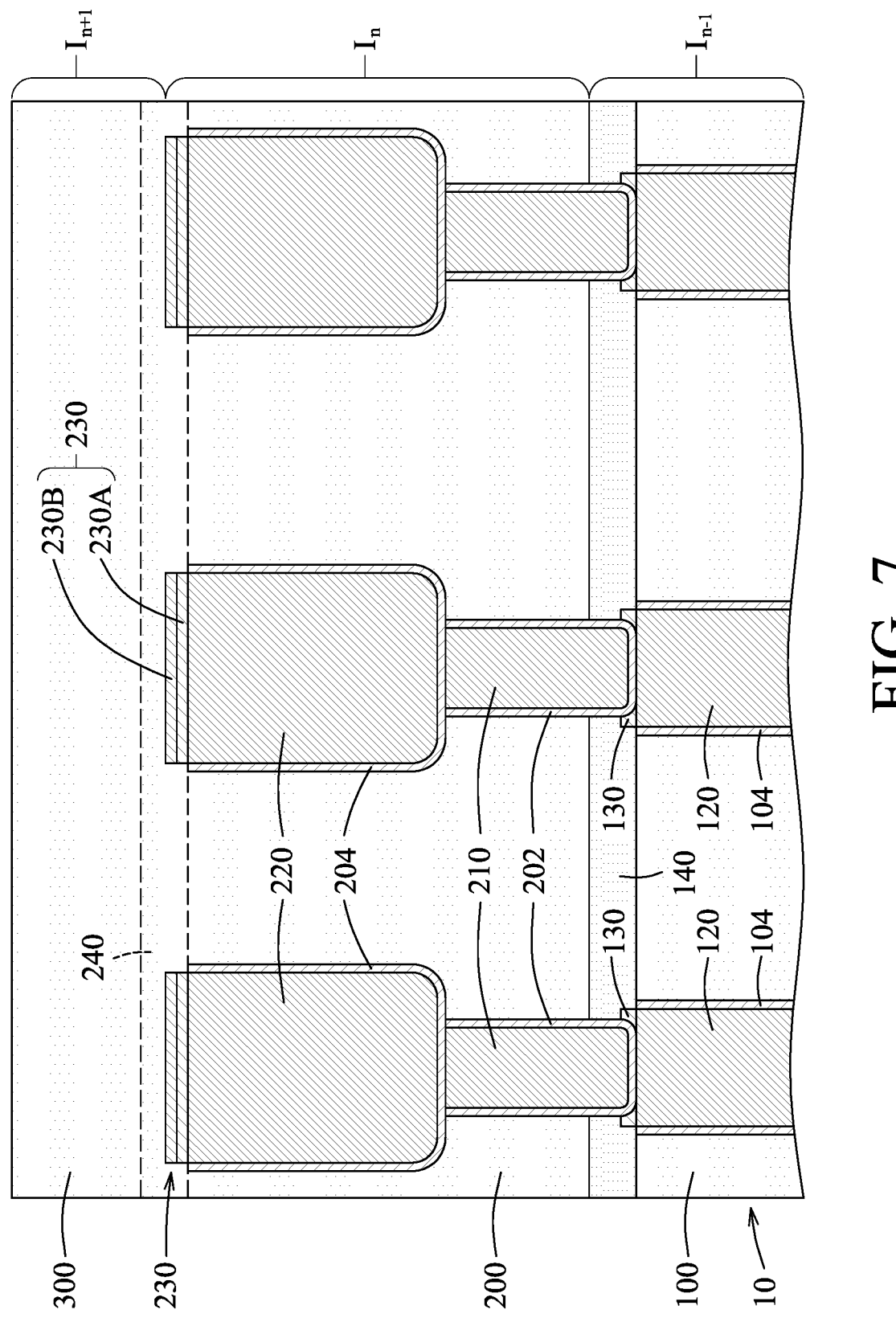

FIG. 7 illustrates a variation of the interconnection structure in accordance with some embodiments. In comparison to FIG. 6, the conductive cap feature 230 in FIG. 7 has a multilayer structure, and includes a metal layer 230A and a non-metal layer 230B that are stacked together in the thickness direction of the substrate 10. In accordance with some embodiments, the metal layer 230A includes cobalt, other suitable materials, or any combination thereof, and the non-metal layer 230B includes graphene, other suitable low-resistance non-metal materials, or any combination thereof. In the illustrative embodiment, the non-metal layer 230B is formed over the metal layer 230A. In some embodiments, the metal layer 230A may be formed over the non-metal layer 230B. The multilayer structure may further enhance the ability to prevent the metal in the interconnection feature from diffusing into the ILD layer 300 of the interconnection layer $I_{n+1}$.

Figure 8:
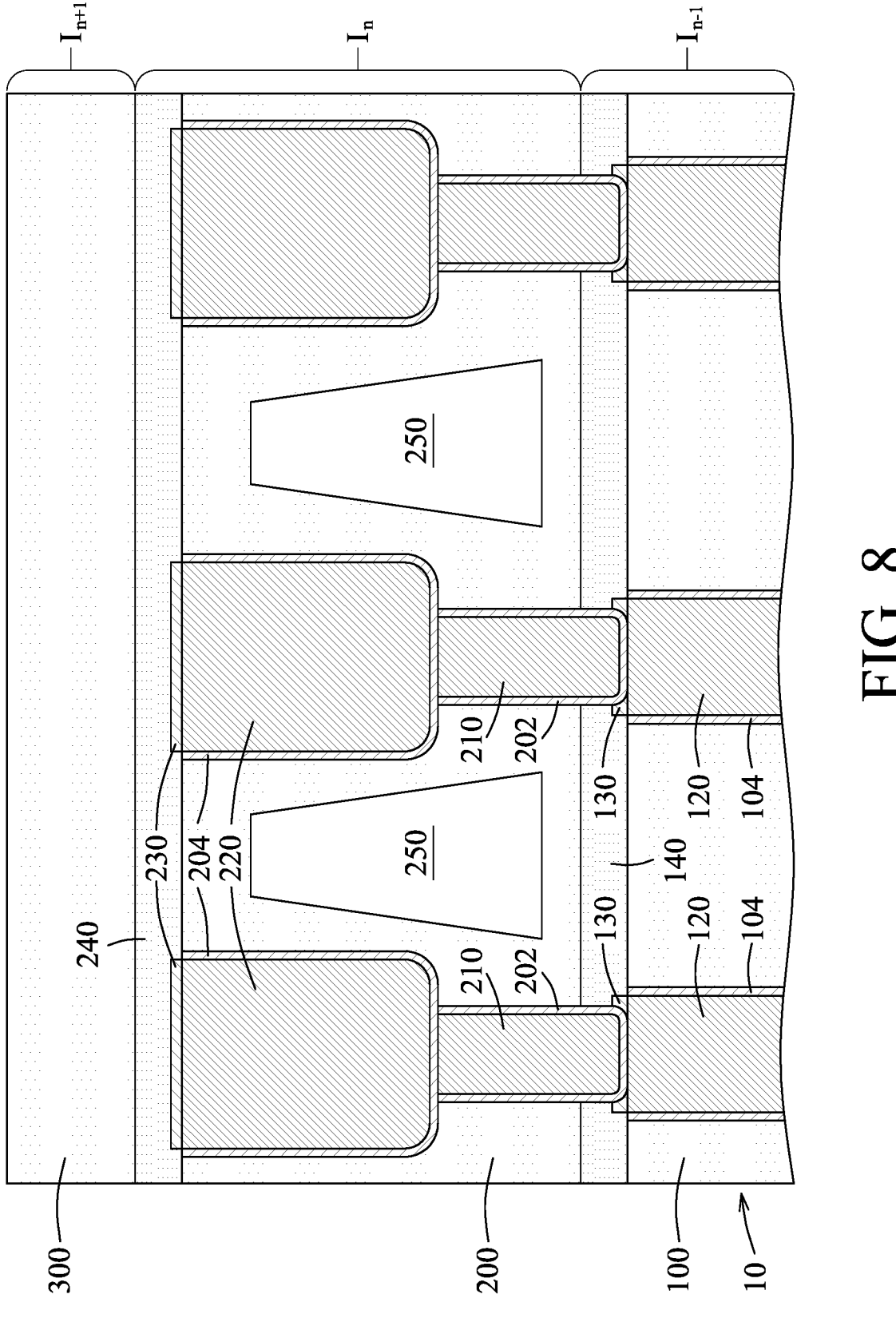

FIG. 8 illustrates a variation of the interconnection structure in accordance with some embodiments. In comparison to FIG. 1, the ILD layer 200 in FIG. 8 is formed with a plurality of air gaps 250 to further reduce overall circuit capacitance because a dielectric constant of the air gaps 250 is approximately one. It is noted that "air gap" is a commonly used term in the industry, but it does not necessarily mean a gap where air is present. In accordance with some embodiments, the term "air gap" refers to a vacuum space where air is not present therein, and this disclosure is not limited in this respect. In accordance with some embodiments, the ILD layer 100 and the ILD layer 300 may also be formed with air gaps therein, and this disclosure is not limited in this respect.

Figure 9:
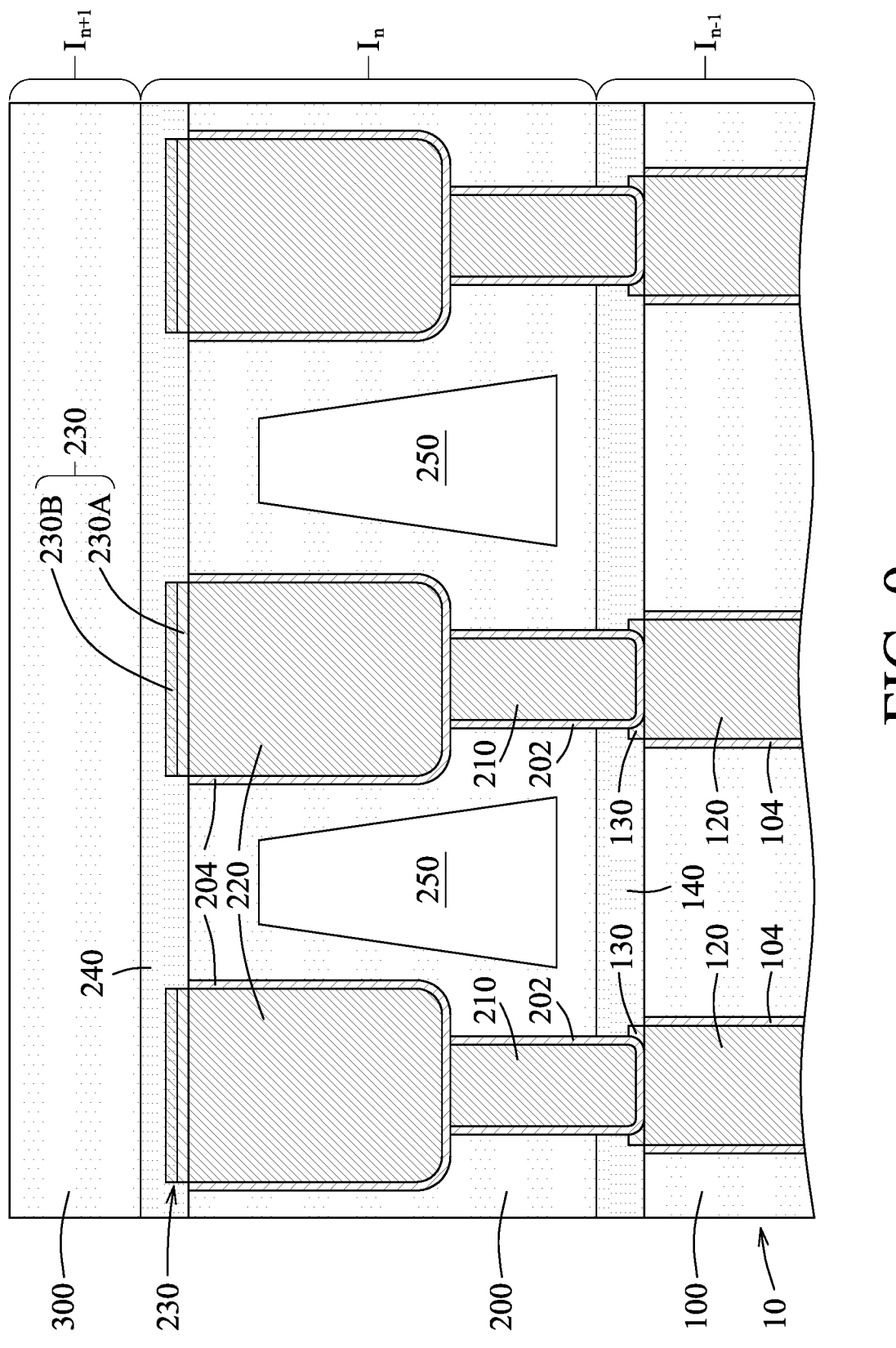

FIG. 9 illustrates a variation of the interconnection structure in accordance with some embodiments. In comparison to FIG. 5, the ILD layer 200 in FIG. 9 is formed with a plurality of air gaps 250 to further reduce overall circuit capacitance. In accordance with some embodiments, the ILD layer 100 and the ILD layer 300 may also be formed with air gaps therein, and this disclosure is not limited in this respect.

Figure 10:
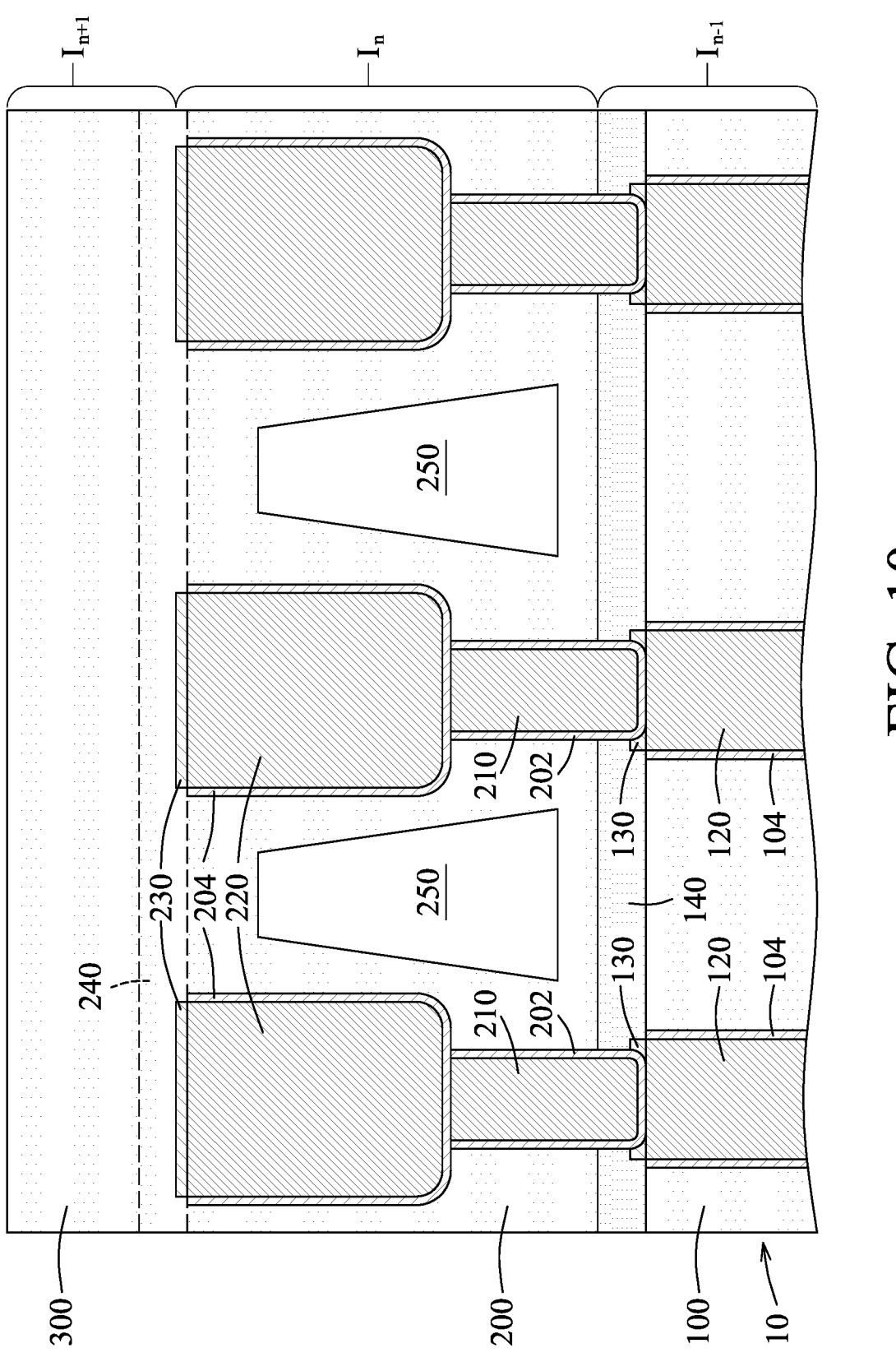

FIG. 10 illustrates a variation of the interconnection structure in accordance with some embodiments. In comparison to FIG. 6, the ILD layer 200 in FIG. 10 is formed with a plurality of air gaps 250 to further reduce overall circuit capacitance. In accordance with some embodiments, the ILD layer 100 and the ILD layer 300 may be formed with air gaps therein, and this disclosure is not limited in this respect.

Figure 11:
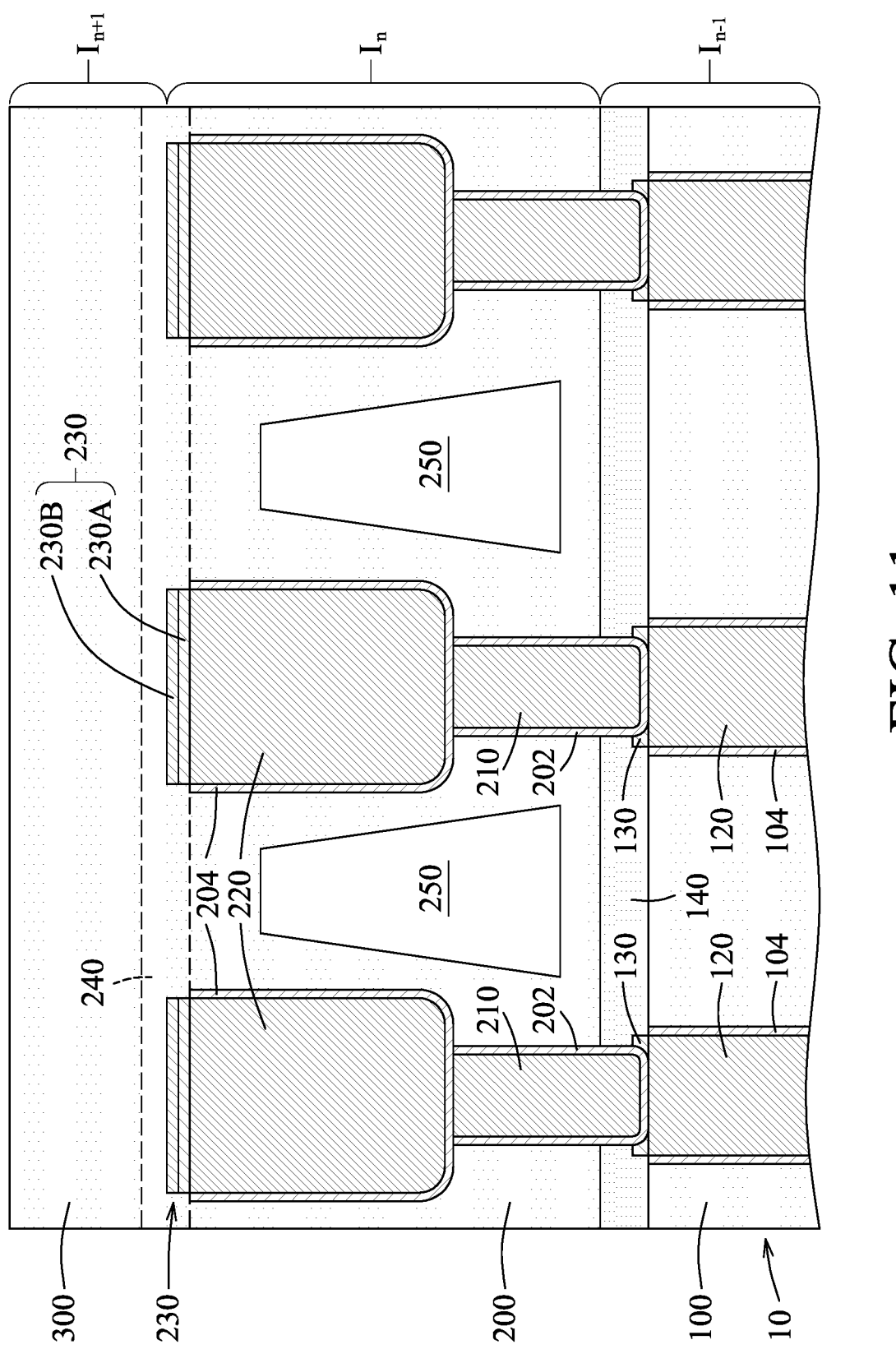

FIG. 11 illustrates a variation of the interconnection structure in accordance with some embodiments. In comparison to FIG. 7, the ILD layer 200 in FIG. 11 is formed with a plurality of air gaps 250 to further reduce overall circuit capacitance. In accordance with some embodiments, the ILD layer 100 and the ILD layer 300 may be formed with air gaps therein, and this disclosure is not limited in this respect.

Figure 12:
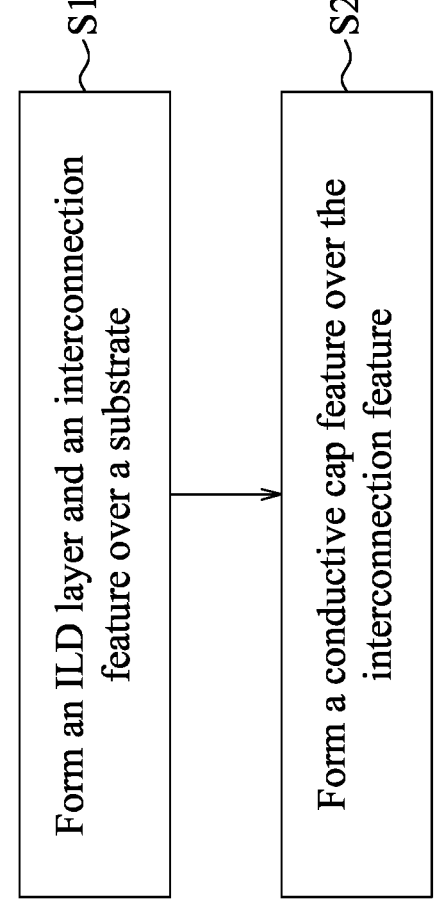
FIG. 12 is a flow chart that illustrates steps of forming the interconnection structure in accordance with some embodiments.

FIG. 12 is a flow chart that cooperates with FIGS. 13 through 22 to illustrate an exemplary process for forming the interconnection structure of the interconnection layer $I_n$ as exemplified in FIG. 1, but this disclosure is not limited thereto.

Figure 13:
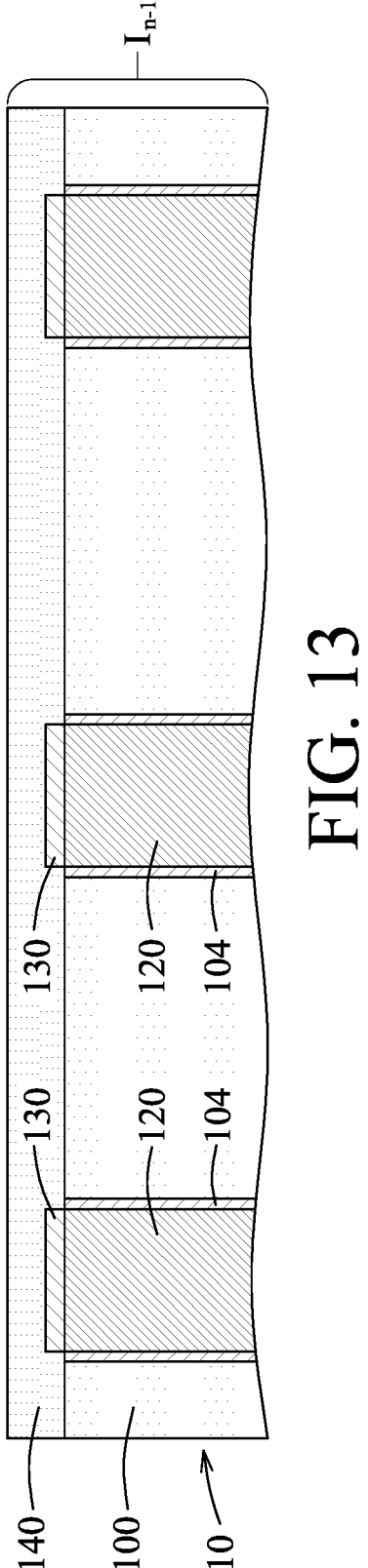
FIGS. 13 through 22 are sectional views that illustrate detailed steps of forming the interconnection structure in accordance with some embodiments.

In FIG. 13, a substrate 10 is provided to include an interconnection layer $I_{n-1}$ formed in an upper portion of the substrate 10 (a lower portion of the substrate 10 is omitted from the drawings). The interconnection layer $I_{n-1}$ includes an ILD layer 100, multiple interconnection features that are formed in the ILD layer 100, multiple conductive cap features 130 that are respectively disposed over the interconnection features, and a hermetic etch stop layer 140 that is formed over ILD layer 100 and the conductive cap features 130. Each of the interconnection features of the interconnection layer $I_{n-1}$ is surrounded by the ILD layer 100 and includes a metal via (not shown) and a metal wire 120 formed over the metal via. A liner layer 104 is disposed between the metal wire 120 and the ILD layer 100.

Figure 14:
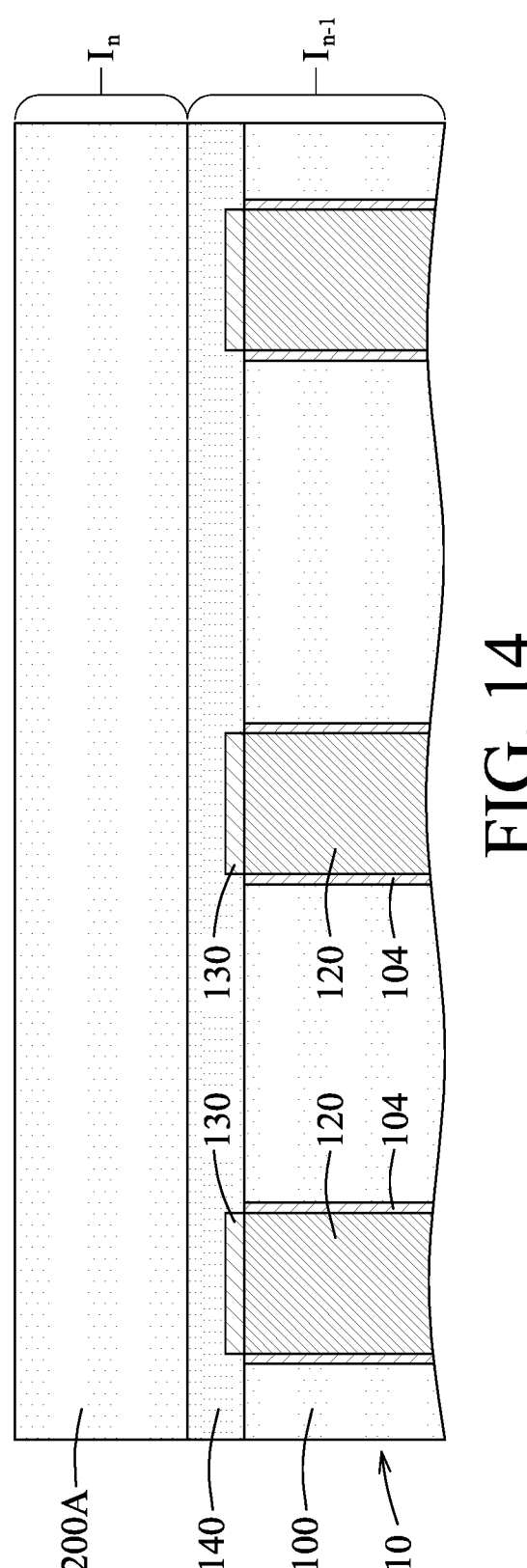

In FIG. 14, an ILD layer 200A is deposited over the interconnection layer $I_{n-1}$ of the substrate 10 using, for example, chemical vapor deposition (CVD), atomic layer deposition (ALD), other suitable deposition techniques, or any combination thereof. In accordance with some embodiments, $Si(CH_3)_4$ and $NH_3$ may be used in the deposition to form the ILD layer 200A of silicon carbon nitride. In accordance with some embodiments, $SiH_4$, $NH_3$ and $C_2H_4$ may be used in the deposition to form the ILD layer 200A of silicon carbon nitride. In accordance with some embodiments, a process temperature of the deposition may range from about 350° C. to about 425° C. An excessively high process temperature (e.g., higher than 425° C.) may result in metal line wiggling, and an excessively low process temperature (e.g., lower than 350° C.) may result in insufficient chemical reaction, which may cause a low mechanical strength of the ILD layer 200A. In accordance with some embodiments, an additional annealing process or ultraviolet (UV) process may be performed after the deposition to enhance the mechanical strength of the ILD layer 200A.

Figure 15:
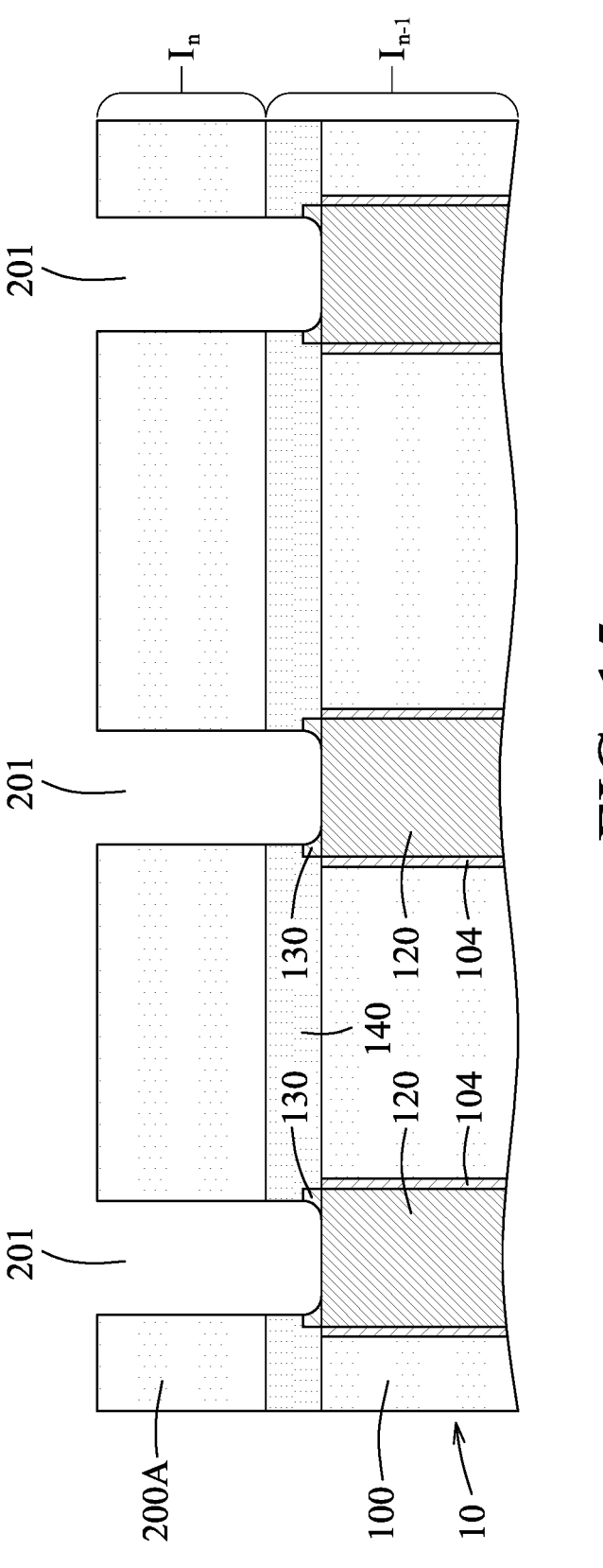

In FIG. 15, the ILD layer 200A, the hermetic etch stop layer 140 and the conductive cap features 130 are etched to form a plurality of via holes 201 using, for example, anisotropic etching, other suitable etching techniques, or any combination thereof. In accordance with some embodiments, only the ILD layer 200A is etched to form the via holes 201. In this illustrative embodiment, the via holes 201 respectively correspond in position to the interconnection features of the interconnection layer $I_{n-1}$ in the thickness direction of the substrate 10, and each of the via holes 201 reveals the metal wire 120 of the corresponding interconnection feature, but this disclosure is not limited in this respect. When the ILD layer 200A is made of silicon carbon nitride, a good etch profile control may be achieved because of the low etching rate, and thus the via holes 201 may have a straight sidewall as desired.

Figure 16:
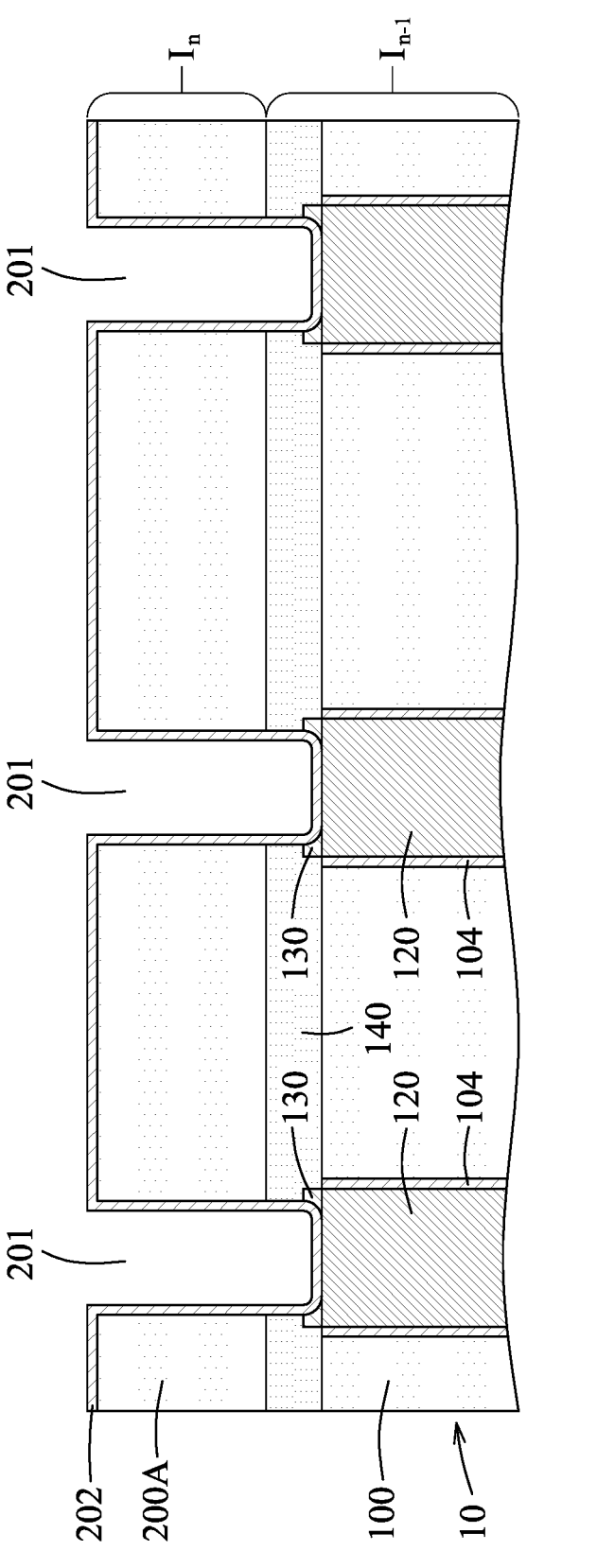

In FIG. 16, a first liner layer 202 is conformally deposited over the ILD layer 200A and in the via holes 201 using, for example, physical vapor deposition (PVD), CVD, ALD, other suitable deposition techniques, or any combination thereof.

Figure 17:
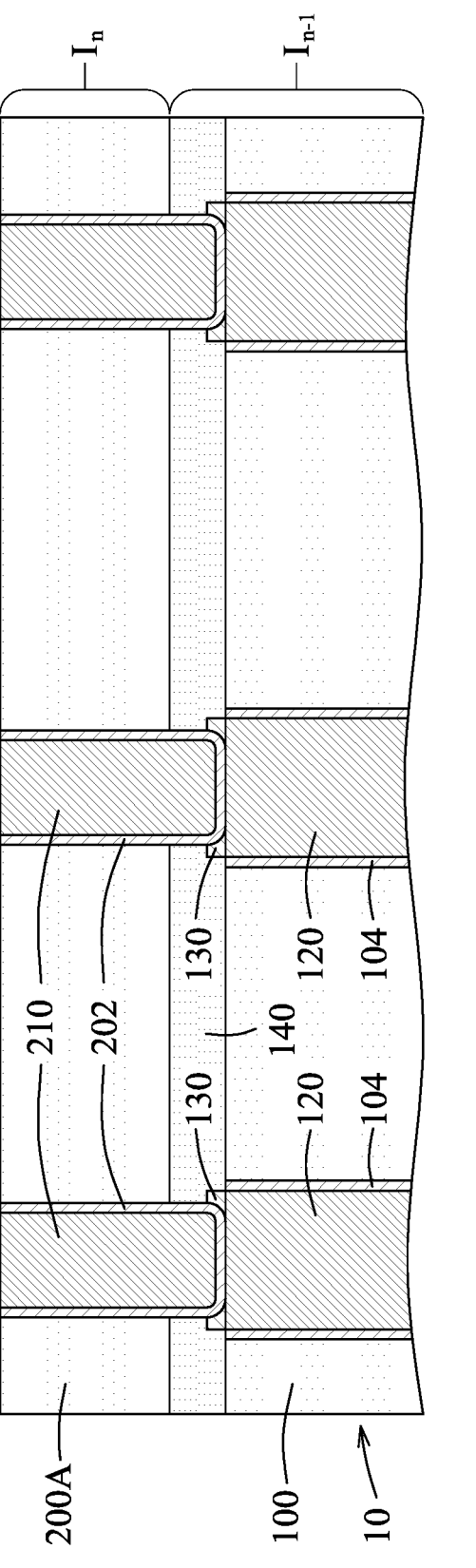

In FIG. 17, a metal layer is deposited over the first liner layer 202 and in the via holes 201, followed by a chemical-mechanical planarization (CMP) process to remove a portion of the metal layer and a portion of the first liner layer 202 that are formed outside of the via holes 201 (i.e., formed on top of the ILD layer 200A), thereby forming a metal via 210 in each of the via holes 201. In accordance with some embodiments, the deposition of the metal layer may be performed using, for example, PVD, CVD, ALD, electroless deposition (ELD), electrochemical plating (ECP), other suitable techniques, or any combination thereof. A process temperature for depositing the metal layer may range from about 350° C. to about 425° C. An excessively high process temperature (e.g., higher than 425° C.) may result in metal line wiggling, and an excessively low process temperature (e.g., lower than 350° C.) may result in high electrical resistance of the metal via 210.

Figure 18:
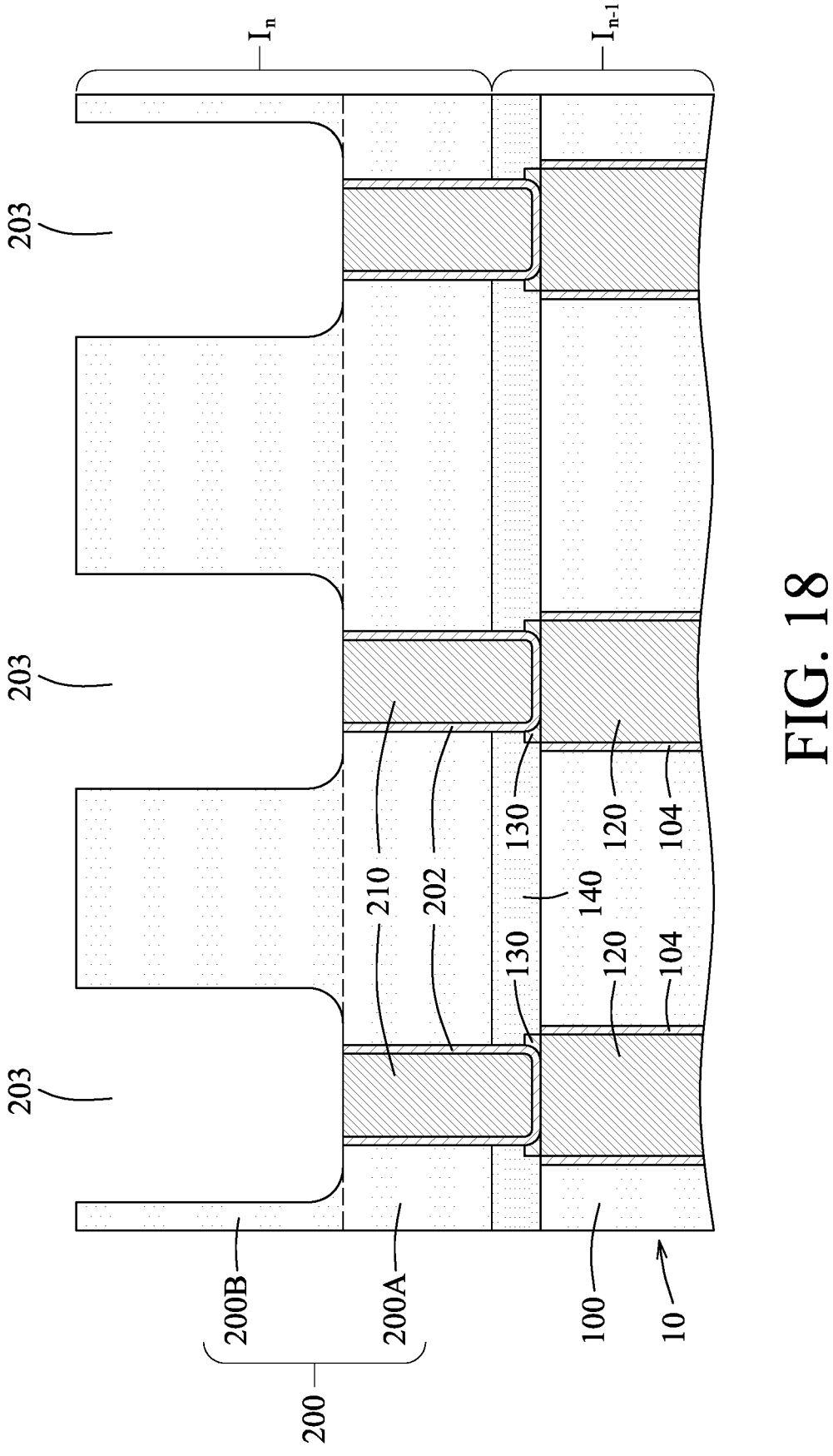

In FIG. 18, another ILD layer 200B is deposited over the ILD layer 200A, and then the ILD layer 200B is etched to form a plurality of wire trenches 203 that reveal the metal vias 210 at a bottom thereof, where the ILD layer 200A and the ILD layer 200B cooperatively form an ILD layer 200 of the interconnection layer $I_n$. In accordance with some embodiments, the ILD layer 200B may be deposited using, for example, CVD, ALD, other suitable deposition techniques, or any combination thereof. In accordance with some embodiments, a process temperature of the deposition may range from about 350° C. to about 425° C. An excessively high process temperature (e.g., higher than 425° C.) may result in metal line wiggling, and an excessively low process temperature (e.g., lower than 350° C.) may result in insufficient chemical reaction, which may cause a low mechanical strength of the ILD layer 200B. In accordance with some embodiments, an additional annealing process or ultraviolet (UV) process may be performed after the deposition to enhance the mechanical strength of the ILD layer 200. In accordance with some embodiments, the ILD layer 200B may be etched using, for example, anisotropic etching, other suitable etching techniques, or any combination thereof. The ILD layer 200A and the ILD layer 200B may be made of either the same material or different materials.

When the ILD layer 200B is made of silicon carbon nitride (which may be either the same as or different from the silicon carbon nitride used in the ILD layer 200A), a good etch profile control may be achieved because of the low etching rate, and thus the wire trenches 203 may have a straight sidewall as desired.

Figure 19:
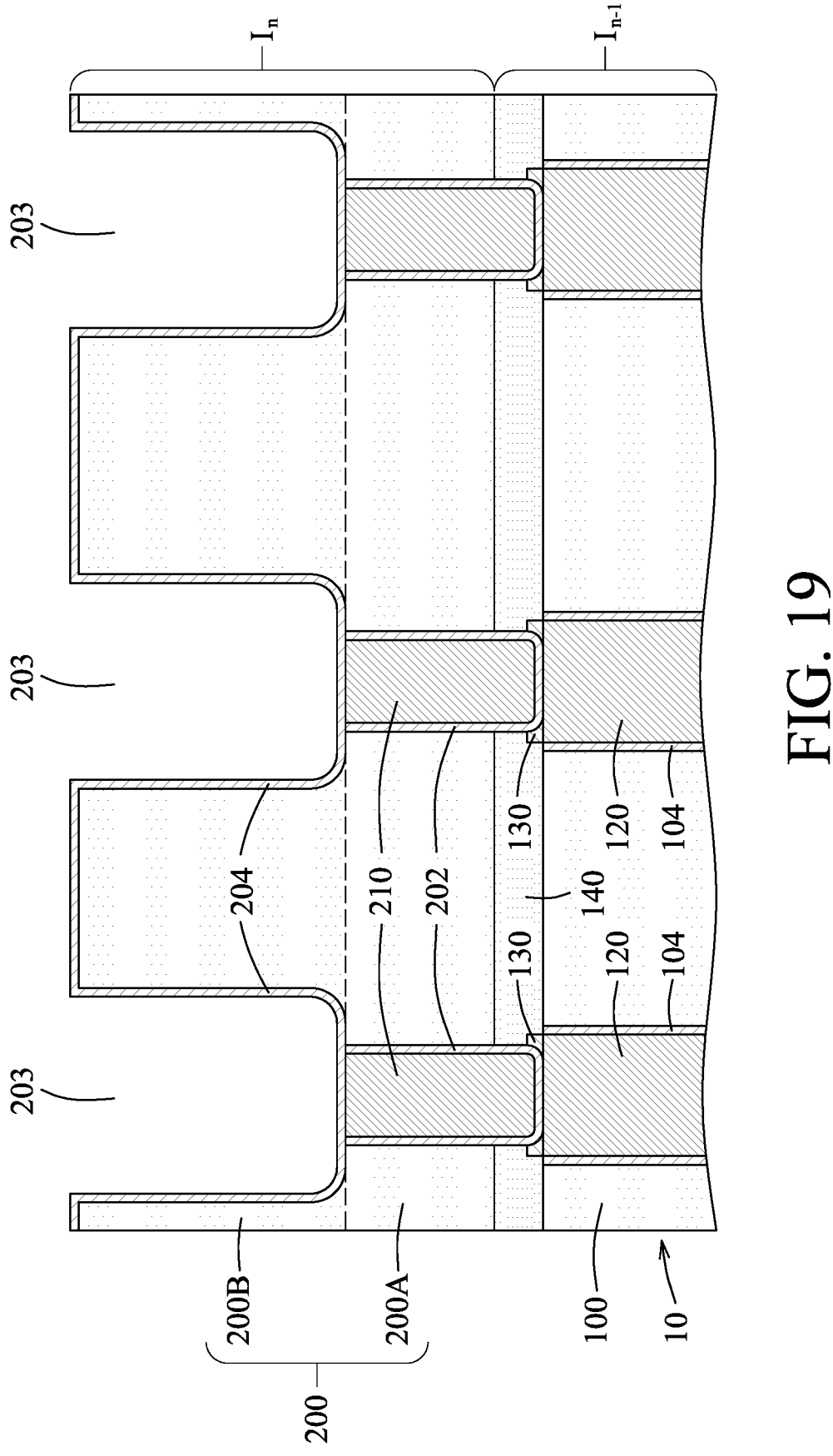

In FIG. 19, a second liner layer 204 is conformally deposited over the ILD layer 200 and in the wire trenches 203 using, for example, PVD, CVD, ALD, other suitable deposition techniques, or any combination thereof.

Figure 20:
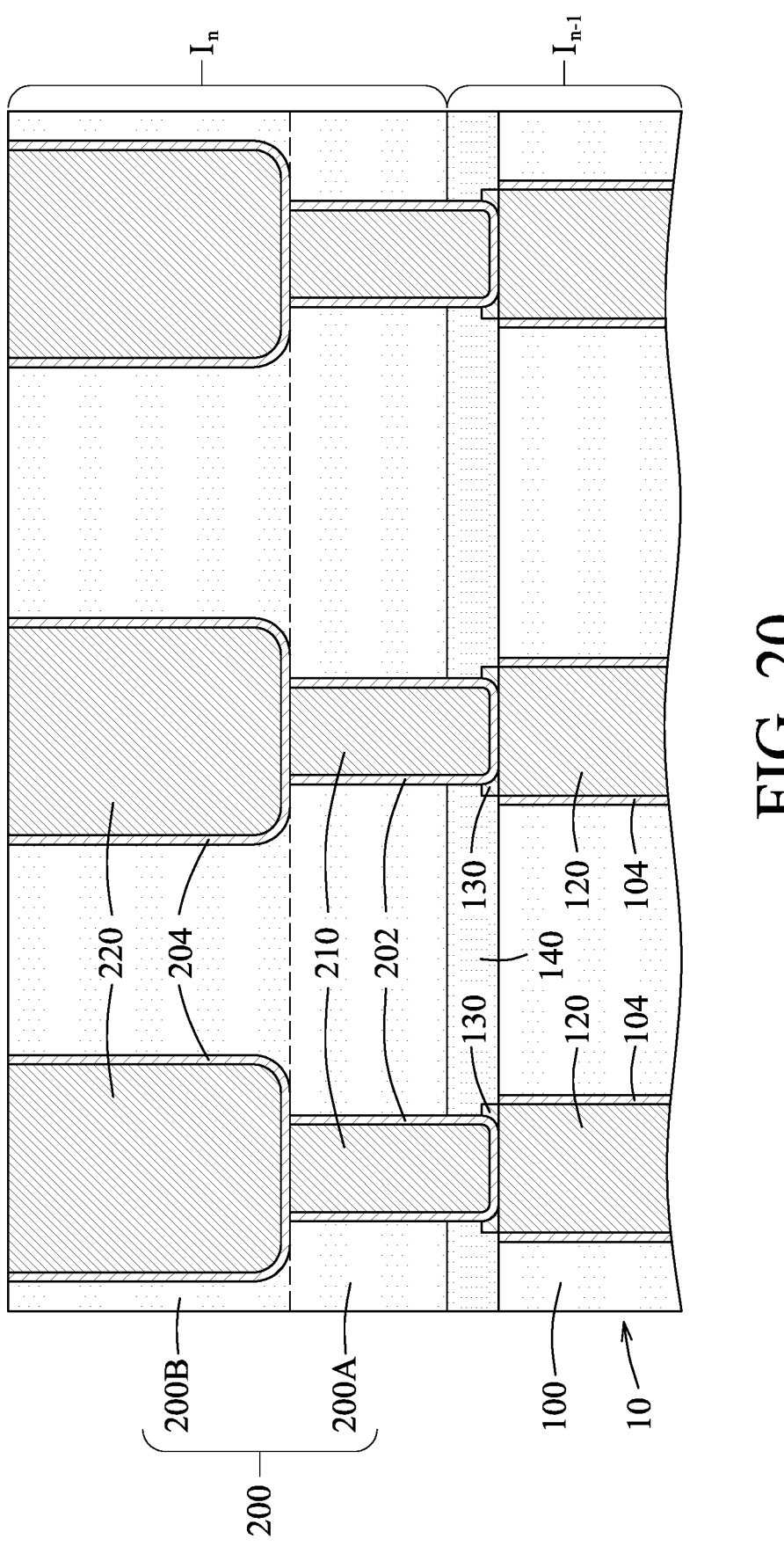

In FIG. 20, a metal layer is deposited over the second liner layer 204 and in the wire trenches 203, followed by a CMP process to remove a portion of the metal layer and a portion of the second liner layer 204 that are formed outside of the wire trenches 203 (i.e., formed on top of the ILD layer 200B), thereby forming a metal wire 220 in each of the wire trenches 203. In accordance with some embodiments, the deposition of the metal layer may be performed using, for example, PVD, CVD, ALD, ELD, ECP, other suitable techniques, or any combination thereof. A process temperature for depositing the metal layer may range from about 350° C. to about 425° C. An excessively high process temperature (e.g., higher than 425° C.) may result in metal line wiggling, and an excessively low process temperature (e.g., lower than 350° C.) may result in high electrical resistance of the metal wire 220. The metal via 210 and the metal wire 220 that are electrically connected together cooperatively form an interconnection feature of the interconnection layer $I_n$.

Through the process steps as illustrated in FIGS. 13 through 20, the ILD layer 200 and the interconnection features are formed over the substrate 10 (step S1 in FIG. 12). In the illustrative embodiment, since each of the metal via 210 and the metal wire 220 is formed using a single damascene process, the second liner layer 204 may have a bottom portion that is disposed between the metal via 210 and the metal wire 220. In accordance with some embodiments, the metal via 210 and the metal wire 220 may be formed using a dual damascene process, and only a single deposition process may be needed to form a liner layer before deposition of a metal layer to fill the wire trenches 203 and the via holes 201 at the same time, so no liner layer will be present between the metal wire 220 and the metal via 210. In accordance with some embodiments where the ILD layer 200 is formed with the air gaps as exemplified in FIGS. 8 through 11, the interconnection features may be formed in a preliminary ILD layer first, followed by removing the preliminary ILD layer, and then depositing the ILD layer 200 using an appropriate deposition technique such as CVD with good growth rate control, so as to form the air gaps in the resultant ILD layer 200. In accordance with some embodiments, a metal layer may be deposited and patterned over the interconnection layer $I_{n-1}$ to form the metal via 210 of each of the interconnection features first, and then the ILD layer 200A may be deposited using an appropriate deposition technique with good growth rate control to form the air gaps in the ILD layer 200A, which corresponds in position to the metal via 210 in the horizontal direction. In accordance with some embodiments, a metal layer may be deposited and patterned over the ILD layer 200A to form the metal wire 220 of each of the interconnection features first, and then the ILD layer 200B may be deposited using an appropriate deposition technique with good growth rate control to form the air gaps in the ILD layer 200B, which corresponds in position to the metal wire 220 in the horizontal directions.

Figure 21:
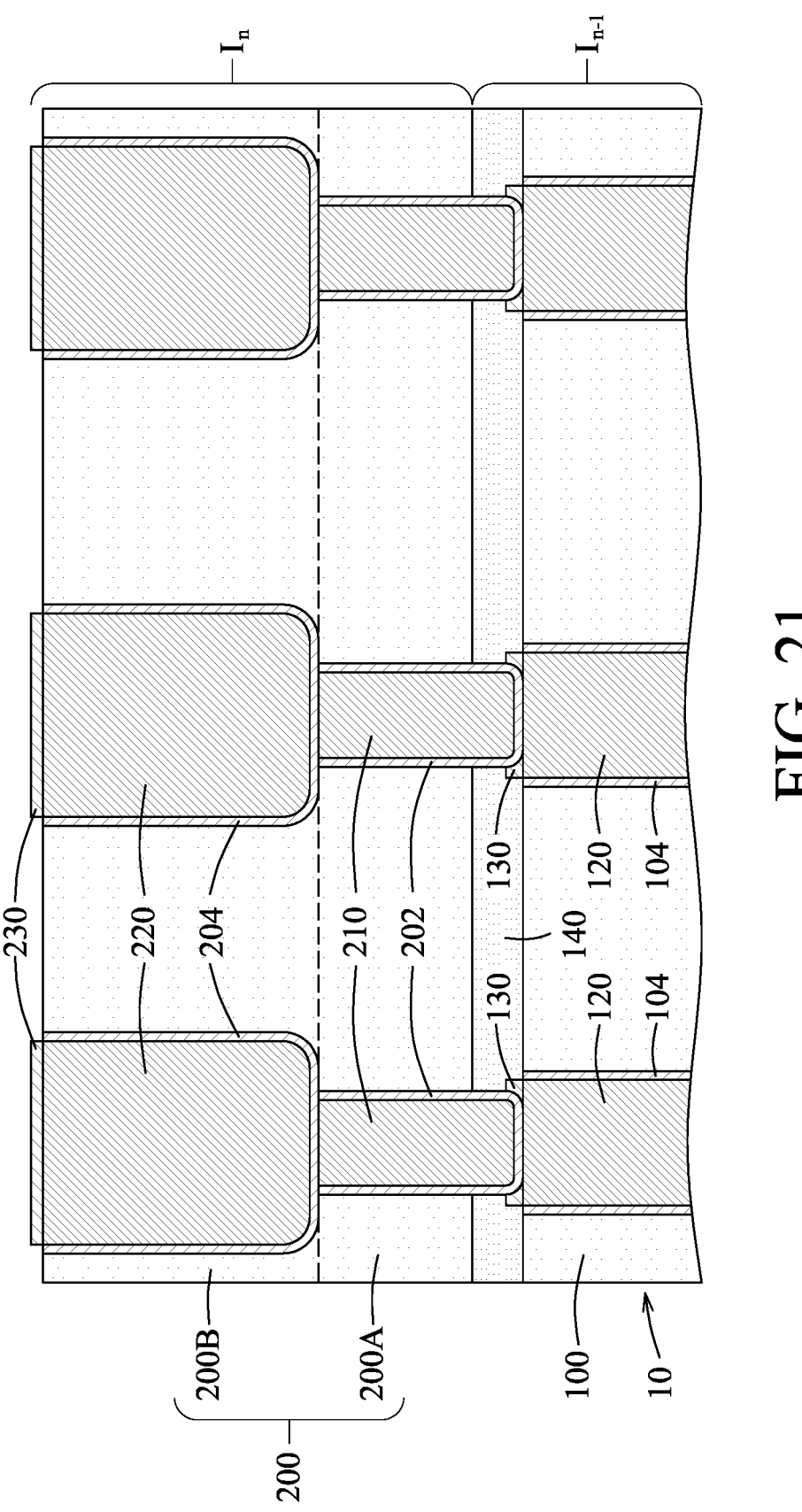

Referring to FIG. 21, after the formation of the interconnection features, for each of the interconnection features, a conductive cap feature 230 is formed over the metal wire 220 of the interconnection feature (step S2 in FIG. 12) using, for example, CVD, ALD, other suitable deposition techniques, or any combination thereof. A process temperature for depositing the conductive cap feature 230 may range from about 350° C. to about 425° C. An excessively high process temperature (e.g., higher than 425° C.) may result in metal line wiggling, and an excessively low process temperature (e.g., lower than 350° C.) may result in high electrical resistance of the conductive cap feature 230. In accordance with some embodiments, since the material that forms the conductive cap feature 230, such as cobalt, graphene, or other suitable materials, can hardly be formed on the dielectric material of the ILD layer 200, the conductive cap feature 230 can be selectively deposited over the metal wire 220, so additional patterning process can be omitted to save manufacturing cost, and the conductive cap feature 230 has the same pattern as the metal wire 220 when viewed from top. In accordance with some embodiments, the conductive cap feature 230 has a single-layer structure, and may have a thickness in a range from about 20 angstroms to about 100 angstroms. In accordance with some embodiments, the conductive cap feature 230 has a multi-layer structure (see FIGS. 5, 7, 9 and 11), and each layer may have a thickness in a range from about 20 angstroms to about 100 angstroms. An excessively thin conductive cap feature 230 may be insufficient for preventing diffusion of the metal in the interconnection feature, and an excessively thick conductive cap feature 230 may result in undesired formation of conductive materials onto the ILD layer 200.

Figure 22:
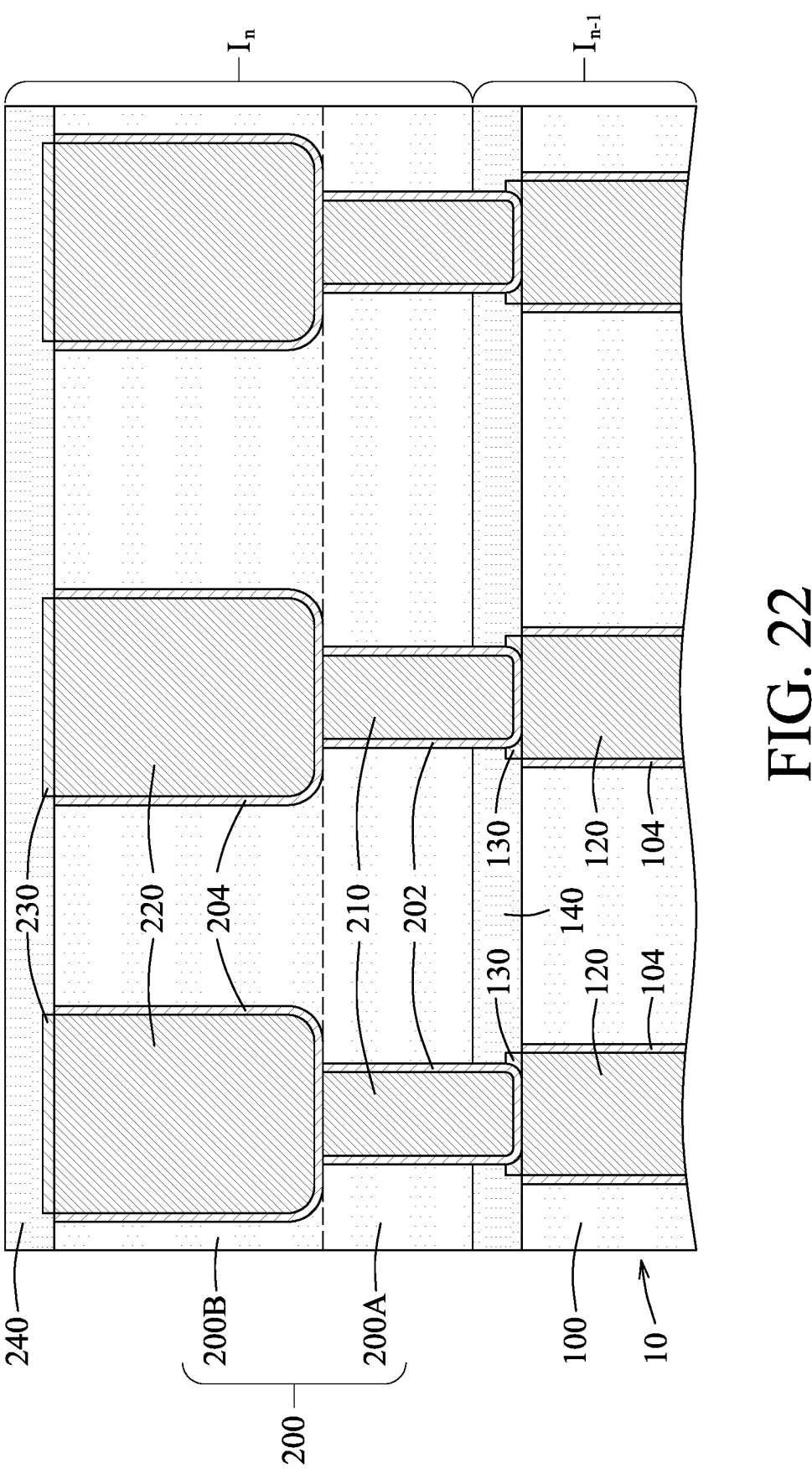

Referring to FIG. 22, a hermetic etch stop layer 240 is deposited over the ILD layer 200 and the conductive cap features 230 using, for example, CVD, ALD, other suitable deposition techniques, or any combination thereof. A process temperature for depositing the hermetic etch stop layer 240 may range from about 350° C. to about 425° C. An excessively high process temperature (e.g., higher than 425° C.) may result in metal line wiggling, and an excessively low process temperature (e.g., lower than 350° C.) may cause the hermetic etch stop layer 240 to have insufficient ability to prevent moisture from entering the interconnection layer $I_n$. In accordance with some embodiments, the hermetic etch stop layer 240 may be made of aluminum nitride or related materials, and the deposition process may be performed using, for example, $Al(CH_3)_3$ with helium or argon plasma post treatment, other suitable processes, or any combination thereof. In accordance with some embodiments, the hermetic etch stop layer 240 may be made of silicon carbon nitride, and the deposition process may be performed under a low pressure using, for example, $Si(CH_3)_4$ with $NH_3$, other suitable process steps, or any combination thereof. In accordance with some embodiments, the hermetic etch stop layer 240 may have a multilayer structure that includes, for example, a layer of silicon carbon nitride, a layer of aluminum oxycarbide, other layer(s) of suitable materials, or any combination thereof, where deposition of the layer of aluminum oxycarbide may be performed using, for example, $Al(CH_3)_3$ with $CO_2$ plasma, other suitable process steps, or any combination thereof.

Figure 23:
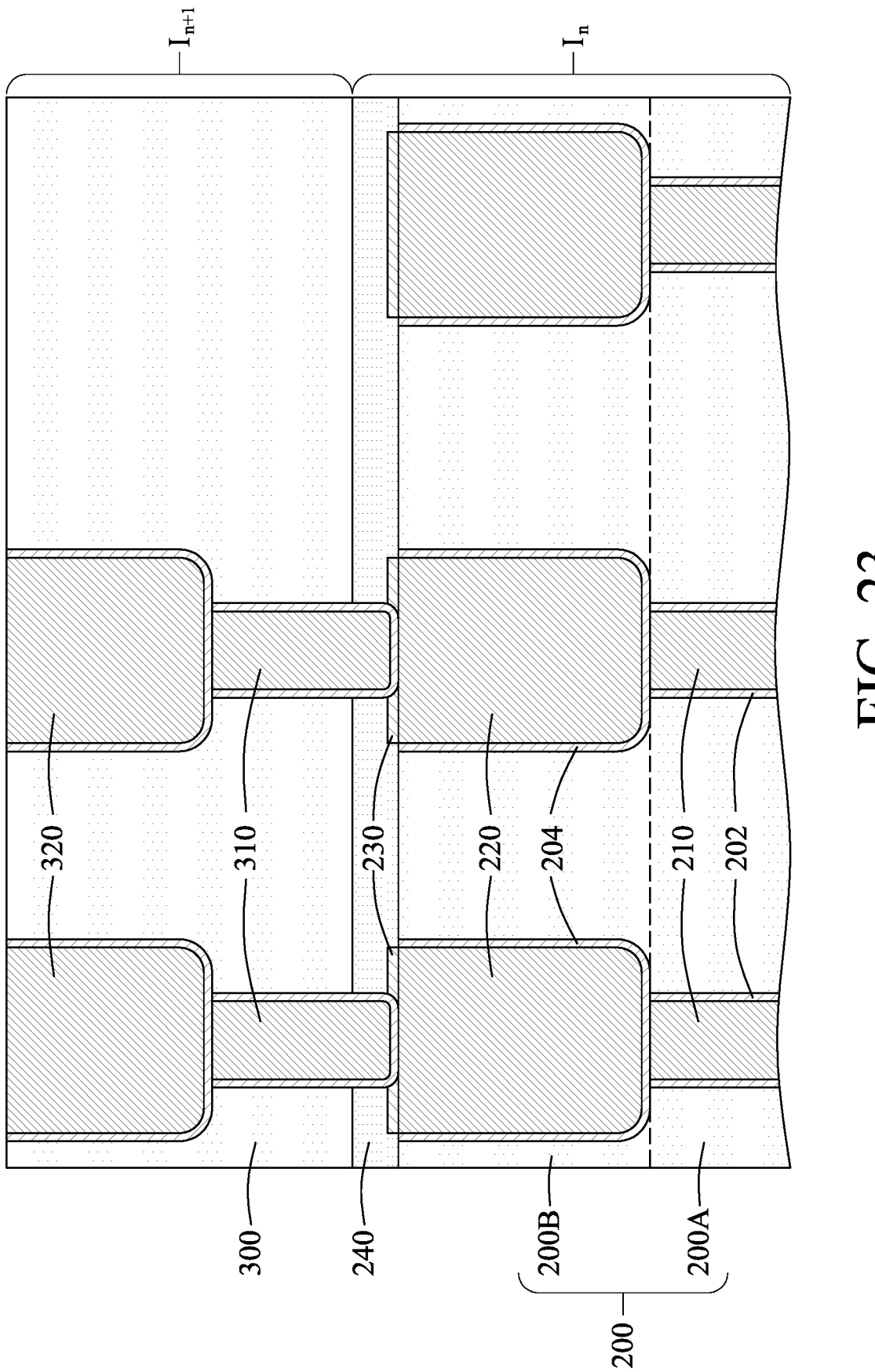
FIGS. 23 and 24 are sectional views that illustrate variations of the interconnection structure in accordance with some embodiments.

Subsequently, an ILD layer 300 of the interconnection layer $I_{n+1}$ may be deposited over the hermetic etch stop layer 240, as exemplified in FIG. 1. The process for depositing the ILD layer 300 may be similar to that for depositing the ILD layer 200, so details thereof are not repeated herein for the sake of brevity. In accordance with some embodiments, the interconnection layer $I_{n+1}$ may have interconnection features formed in the ILD layer 300, as exemplified in FIG. 23. Each of the interconnection features of the interconnection layer $I_{n+1}$ may include a metal via 310 and a metal wire 320 that is disposed over and electrically connected to the metal via 310, which is similar to the interconnection features of the interconnection layer $I_n$, so details thereof are not repeated herein for the sake of brevity.

Figure 24:
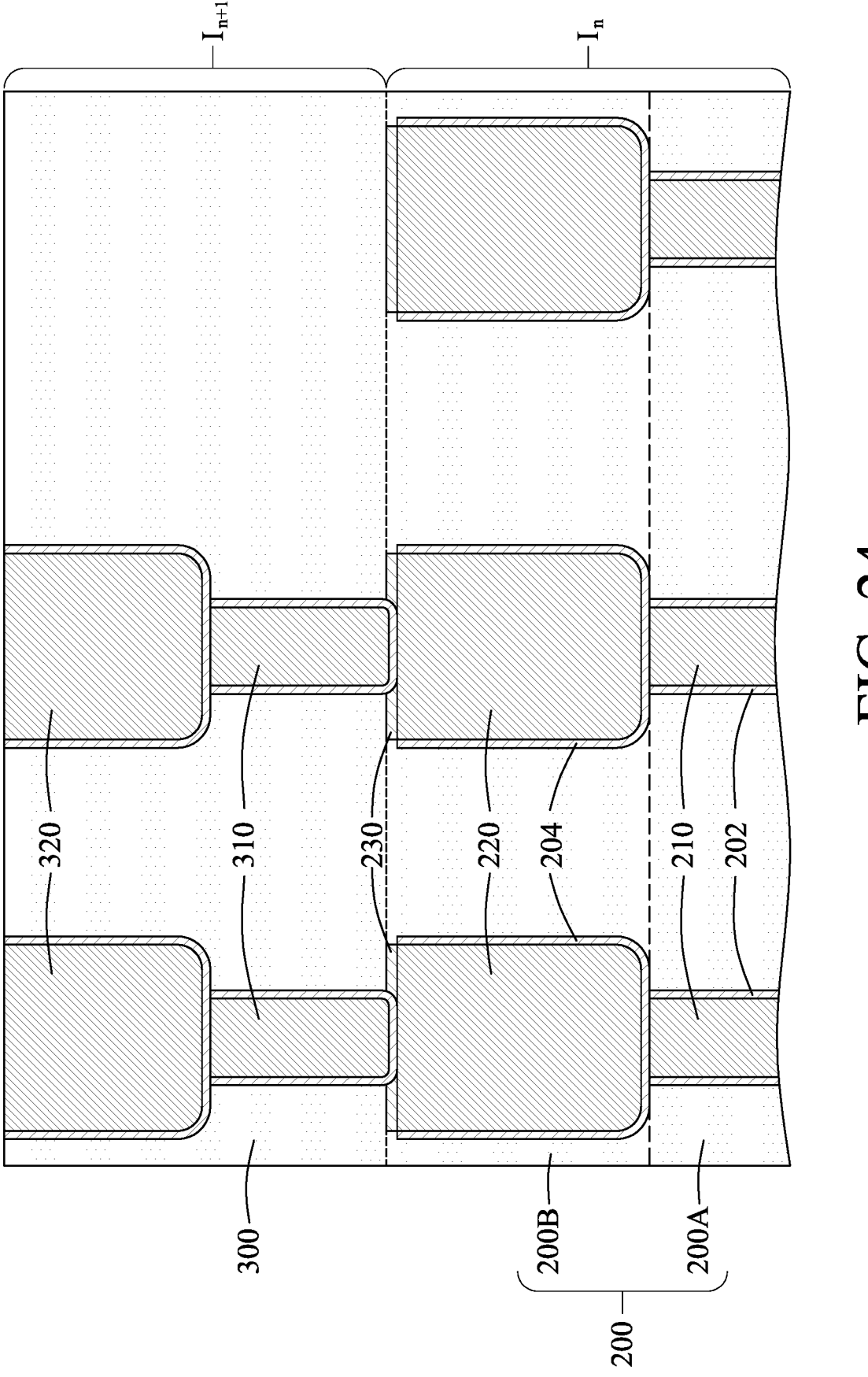

In accordance with some embodiments, the interconnection layer $I_n$ may be formed to have an ESL-free structure, and the deposition of the hermetic etch stop layer 240 may be omitted. In such a scenario, the ILD layer 300 of the interconnection layer $I_{n+1}$ may be directly deposited over the ILD layer 200 and the conductive cap feature s 230, as exemplified in FIG. 6. In accordance with some embodiments, the interconnection layer $I_{n+1}$ may have interconnection features formed in the ILD layer 300, as exemplified in FIG. 24. Each of the interconnection features of the interconnection layer $I_{n+1}$ may include a metal via 310 and a metal wire 320, which is similar to the interconnection features of the interconnection layer $I_n$, so details thereof are not repeated herein for the sake of brevity.

In summary, the ILD layer of the interconnection layer in accordance with some embodiments is formed using silicon carbon nitride ($Si_xC_yN_z$, or simply SiCN), so as to achieve better thermal conductivity, better mechanical strength, and better resistance against etching process, thereby enhancing IC performance. The conductive cap features may include a graphene layer in accordance with some embodiments, so as to achieve better electrical conductance for the interconnection features.

In accordance with some embodiments, an interconnection structure is provided to include an interlayer dielectric (ILD) layer that is disposed over a substrate, a metal via that is disposed in the ILD layer, and a metal wire that is disposed over the metal via in the ILD layer, and that is electrically connected to the metal via. The ILD layer includes silicon carbon nitride.

In accordance with some embodiments, the interconnection structure further includes a conductive cap feature disposed over the metal wire, wherein the conductive cap feature includes a graphene layer.

In accordance with some embodiments, the graphene layer has a thickness in a range from 20 angstroms to 100 angstroms.

In accordance with some embodiments, the conductive cap feature further includes a metal layer. The metal layer and the graphene layer are stacked together.

In accordance with some embodiments, the interconnection structure further includes an etch stop layer that is disposed over the conductive cap feature. The etch stop layer includes one of aluminum nitride and silicon carbon nitride.

In accordance with some embodiments, the interconnection structure further includes an etch stop layer that is disposed over the conductive cap feature. The etch stop layer includes silicon carbon nitride and one of aluminum oxide, aluminum nitride and aluminum oxycarbide.

In accordance with some embodiments, the interconnection structure further includes an etch stop layer that is disposed over the conductive cap feature and that includes silicon carbon nitride. An atomic ratio among silicon, carbon and nitrogen in the silicon carbon nitride of the ILD layer is $x_1:y_1:z_1$. The etch stop layer includes silicon carbon nitride, and an atomic ratio among silicon, carbon and nitrogen in the silicon carbon nitride of the etch stop layer is $x_2:y_2:z_2$. The atomic ratio $x_1:y_1:z_1$ is different from the atomic ratio $x_2:y_2:z_2$.

In accordance with some embodiments, the interconnection structure further includes another ILD layer, another metal via and another metal wire. The another ILD layer is disposed over and in contact with the ILD layer and the conductive cap feature, and includes silicon carbon nitride. The another metal via is disposed in the another ILD layer. The another metal wire is disposed over the another metal via in the another ILD layer, and is electrically connected to the another metal via.

In accordance with some embodiments, an interconnection structure is provided to include a metal via that is disposed over a substrate, a metal wire that is disposed over the metal via, and an interlayer dielectric (ILD) layer that surrounds the metal via and the metal wire. The metal via electrically connects the metal wire to a conductive feature that is disposed in the substrate. The ILD layer includes silicon carbon nitride.

In accordance with some embodiments, the interconnection structure further includes a conductive cap feature disposed over the metal wire, wherein the conductive cap feature includes a graphene layer.

In accordance with some embodiments, the graphene layer has a thickness in a range from 20 angstroms to 100 angstroms.

In accordance with some embodiments, the conductive cap feature further includes a metal layer, wherein the metal layer and the graphene layer are stacked together.

In accordance with some embodiments, the interconnection structure further includes an etch stop layer that is disposed over the conductive cap feature. The etch stop layer includes one of aluminum nitride and silicon carbon nitride.

In accordance with some embodiments, the interconnection structure further includes an etch stop layer that is disposed over the conductive cap feature. The etch stop layer includes silicon carbon nitride and one of aluminum oxide, aluminum nitride and aluminum oxycarbide.

In accordance with some embodiments, the interconnection structure further includes an etch stop layer that is disposed over the conductive cap feature and that includes silicon carbon nitride. An atomic ratio among silicon, carbon and nitrogen in the silicon carbon nitride of the ILD layer is $x_1:y_1:z_1$. The etch stop layer includes silicon carbon nitride, and an atomic ratio among silicon, carbon and nitrogen in the silicon carbon nitride of the etch stop layer is $x_2:y_2:z_2$. The atomic ratio $x_1:y_1:z_1$ is different from the atomic ratio $x_2:y_2:z_2$.

In accordance with some embodiments, the interconnection structure further includes another ILD layer, another metal via and another metal wire. The another ILD layer is disposed over and in contact with the ILD layer and the conductive cap feature, and includes silicon carbon nitride. The another metal via is disposed in the another ILD layer. The another metal wire is disposed over the another metal via in the another ILD layer, and is electrically connected to the another metal via.

In accordance with some embodiments, a method is provided for fabricating an interconnection structure on a substrate. In one step, an interconnection feature is formed over a substrate. In one step, an interlayer dielectric (ILD) layer is deposited over the substrate. The interconnection feature includes a metal via that is disposed over the substrate, and a metal wire that is disposed over the metal via and that is electrically connected to the metal via. The ILD layer surrounds the interconnection feature, and includes silicon carbon nitride.

In accordance with some embodiments, in one step, a conductive cap feature is selectively deposited over the metal wire. The conductive cap feature includes a graphene layer.

In accordance with some embodiments, the graphene layer has a thickness in a range from 20 angstroms to 100 angstroms.

In accordance with some embodiments, in one step, another ILD layer is deposited over the ILD layer and the conductive cap feature. In one step, another interconnection feature is formed over the ILD layer. The another interconnection feature includes another metal via that is disposed over the conductive cap feature, and another metal wire that is disposed over the another metal via and that is electrically connected to the another metal via. The another ILD layer is in contact with the conductive cap feature and the ILD layer, surrounds the another interconnection feature, and includes silicon carbon nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnection structure, comprising:
a silicon carbon nitride (SiCN) layer disposed over a substrate, wherein an atomic ratio among silicon, carbon and nitrogen in the SiCN layer is configured such that the SiCN layer has a dielectric constant ranging from 2.5 to 3.6;
a metal via that is disposed in the SiCN layer; and
a metal wire that is disposed over the metal via in the SiCN layer, and that is electrically connected to the metal via.

2. The interconnection structure according to claim 1, further comprising a conductive cap feature disposed over the metal wire, and an etch stop layer that is disposed over the SiCN layer and the conductive cap feature, wherein a material of a portion of the etch stop layer that is in contact with a top surface of the conductive cap feature is same as a material of a portion of the etch stop layer that is in contact with a lateral surface of the conductive cap feature.

3. The interconnection structure according to claim 2, wherein the conductive cap feature includes a graphene layer that is in contact with the etch stop layer, and a material of a portion of the etch stop layer that is in contact with a top surface of the graphene layer is same as a material of a portion of the etch stop layer that is in contact with a lateral surface of the graphene layer.

4. The interconnection structure according to claim 2, wherein the etch stop layer includes a layer of silicon carbon nitride and a layer of aluminum oxide that are stacked together.

5. The interconnection structure according to claim 2, wherein the etch stop layer includes a layer of silicon carbon nitride and a layer of aluminum oxycarbide that are stacked together.

6. The interconnection structure according to claim 2, wherein the etch stop layer is a layer of SiCN, and an atomic ratio among silicon, carbon and nitrogen in the etch stop layer is same as the atomic ratio among silicon, carbon and nitrogen in the SiCN layer.

7. An interconnection structure, comprising:
a metal via that is disposed over a substrate;
a metal wire that is disposed over the metal via, wherein the metal via electrically connects the metal wire to a conductive feature that is disposed in the substrate;
a silicon carbon nitride (SiCN) layer that surrounds the metal via and the metal wire; and
a hermetic etch stop layer disposed over the SiCN layer.

8. The interconnection structure according to claim 7, further comprising a conductive cap feature disposed over the metal wire and in the hermetic etch stop layer, wherein the conductive cap feature includes a graphene layer that is covered and surrounded by the hermetic etch stop layer.

9. The interconnection structure according to claim 8, wherein the hermetic etch stop layer includes a layer of silicon carbon nitride and multiple layers of different aluminum-based materials.

10. The interconnection structure according to claim 8, wherein the hermetic etch stop layer is a layer of SiCN, and an atomic ratio among silicon, carbon and nitrogen in the hermetic etch stop layer is same as an atomic ratio among silicon, carbon and nitrogen in the SiCN layer.

11. An interconnection structure, comprising:
a first interconnection metal feature disposed over a substrate;
a first silicon carbon nitride (SiCN) layer surrounding the first interconnection metal feature;
a conductive cap feature disposed over the first interconnection metal feature, and including graphene;
an etch stop layer disposed over the first dielectric layer, the first interconnection metal feature, and the conductive cap feature;
a second interconnection metal feature disposed over and electrically connected to the first interconnection metal feature, and extending through the etch stop layer and the conductive cap feature; and
a second SiCN layer surrounding the second interconnection metal feature.

12. The interconnection structure according to claim 11, wherein the etch stop layer is a layer of silicon carbon nitride, and an atomic ratio among silicon, carbon and nitrogen in the first SiCN layer is same as an atomic ratio among silicon, carbon and nitrogen in the etch stop layer.

13. The interconnection structure according to claim 1, wherein the atomic ratio among silicon, carbon and nitrogen in the SiCN layer is configured such that the SiCN layer has a thermal conductivity ranging from 0.6 W/(m·K) to about 1.3 W/(m·K).

14. The interconnection structure according to claim 1, further comprising a liner layer sandwiched between the SiCN layer and the metal wire and between the metal wire and the metal via.

15. The interconnection structure according to claim 14, further comprising another liner layer sandwiched between the SiCN layer and the metal via.

16. The interconnection structure according to claim 15, wherein the substrate includes an interlayer dielectric (ILD) layer, another metal wire disposed in the ILD layer, and another conductive cap feature disposed over said another metal wire, and
wherein said another liner layer extends through said another conductive cap feature and is in contact with said another metal wire.

17. The interconnection structure according to claim 1, further comprising an air gap disposed in the SiCN layer, wherein the air gap has an upper portion adjacent to the metal wire, and a lower portion adjacent to the metal via.

18. The interconnection structure according to claim 17, wherein the lower portion of the air gap is wider than the upper portion of the air gap.

19. The interconnection structure according to claim 8, wherein an atomic ratio among silicon, carbon and nitrogen in the SiCN layer is configured such that the SiCN layer has a thermal conductivity ranging from 0.6 W/(m·K) to about 1.3 W/(m·K), and a dielectric constant ranging from 2.5 to 3.6.

20. The interconnection structure according to claim 8, further comprising:

another metal via disposed in the SiCN layer;

another metal wire disposed over the metal via and in the SiCN layer; and an air gap disposed in the SiCN layer, and having an upper portion disposed between and adjacent to the metal wire and said another metal wire, and a lower portion disposed between and adjacent to the metal via and said another metal via, wherein the air gap has a width that gradually reduces from top to bottom.

\* \* \* \* \*